(12) United States Patent
Hatakeyama et al.

(10) Patent No.: US 9,785,049 B2
(45) Date of Patent: Oct. 10, 2017

(54) METHOD FOR FORMING MULTI-LAYER FILM AND PATTERNING PROCESS

(71) Applicant: SHIN-ETSU CHEMICAL CO., LTD., Tokyo (JP)

(72) Inventors: Jun Hatakeyama, Jyoetsu (JP); Daisuke Kori, Jyoetsu (JP)

(73) Assignee: SHIN-ETSU CHEMICAL CO., LTD., Annaka-Shi, Gunma (JP)

( * ) Notice: Subject to any disclaimer, the term of this patent is extended or adjusted under 35 U.S.C. 154(b) by 0 days.

(21) Appl. No.: 15/379,123

(22) Filed: Dec. 14, 2016

(65) Prior Publication Data

US 2017/0199457 A1    Jul. 13, 2017

(30) Foreign Application Priority Data

Jan. 12, 2016   (JP) ................................ 2016-003629

(51) Int. Cl.
*G03F 7/09*    (2006.01)
*G03F 7/004*   (2006.01)
(Continued)

(52) U.S. Cl.
CPC ............ *G03F 7/094* (2013.01); *G03F 7/0045* (2013.01); *G03F 7/0382* (2013.01); *G03F 7/162* (2013.01);
(Continued)

(58) Field of Classification Search
CPC ...... G03F 7/094; G03F 7/0045; G03F 7/0382; G03F 7/162; G03F 7/168; G03F 7/2041;
(Continued)

(56) References Cited

U.S. PATENT DOCUMENTS

| 6,107,195 A | 8/2000 | Gittleman et al. |
| 2001/0025205 A1 | 9/2001 | Chern et al. |

(Continued)

FOREIGN PATENT DOCUMENTS

| JP | H8-246152 A | 9/1996 |
| JP | H11-26401 A | 1/1999 |

(Continued)

OTHER PUBLICATIONS

Yao et al., "New Spin-on Metal Hardmask Materials for Lithography Processes". Proc of SPIE, vol. 8682. pp. 8682051-86820510, 2013.

(Continued)

*Primary Examiner* — Karen Kushumakar
(74) *Attorney, Agent, or Firm* — Oliff PLC

(57) ABSTRACT

The present invention provides a method for forming a multi-layer film, including (i) forming an under layer film on a substrate by applying an under layer film material containing one or more species selected from resins having a repeating unit shown by the formula (1), resins having a repeating unit shown by the formula (2), and compounds shown by the formula (3), each containing a fluorene structure, and curing the same by heat treatment at 300° C. to 800° C. for 10 to 4,000 seconds; (ii) forming a titanium nitride film or a titanium oxynitride film on the under layer film; (iii) forming a hydrocarbon film on the titanium nitride film or the titanium oxynitride film; and (iv) forming a silicon oxide film on the hydrocarbon film. This can form a multi-layer film with reduced reflectance useful for a patterning process with high dimensional accuracy in dry etching.

(Continued)

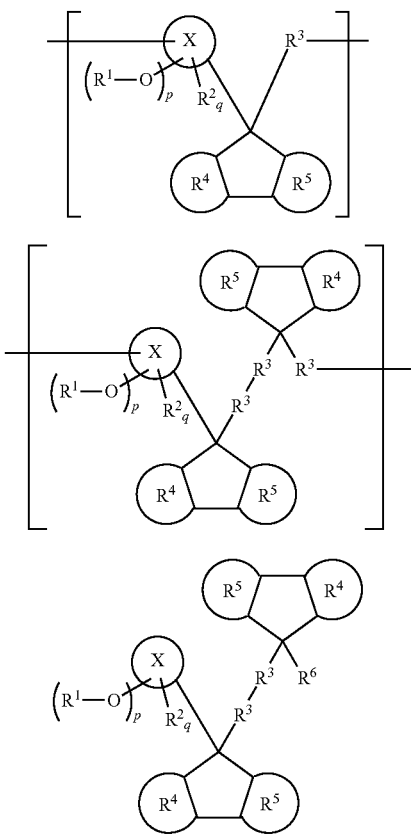

20 Claims, 7 Drawing Sheets

(51) Int. Cl.
| | |
|---|---|
| *G03F 7/038* | (2006.01) |
| *G03F 7/16* | (2006.01) |
| *G03F 7/20* | (2006.01) |
| *H01L 21/311* | (2006.01) |
| *H01L 21/02* | (2006.01) |
| *G03F 7/32* | (2006.01) |
| *G03F 7/40* | (2006.01) |

(52) U.S. Cl.
CPC ............ *G03F 7/168* (2013.01); *G03F 7/2041* (2013.01); *G03F 7/322* (2013.01); *G03F 7/40* (2013.01); *H01L 21/02266* (2013.01); *H01L 21/02271* (2013.01); *H01L 21/02282* (2013.01); *H01L 21/31116* (2013.01); *H01L 21/31144* (2013.01)

(58) Field of Classification Search
CPC ..... G03F 7/322; G03F 7/40; H01L 21/02266; H01L 21/02271; H01L 21/02282; H01L 21/31116; H01L 21/31144
See application file for complete search history.

(56) References Cited

U.S. PATENT DOCUMENTS

| | | |
|---|---|---|
| 2002/0125123 A1 | 9/2002 | Ngan et al. |
| 2004/0241577 A1* | 12/2004 | Hatakeyama ........... G03F 7/038 430/270.1 |
| 2004/0259037 A1* | 12/2004 | Hatakeyama ........... G03F 7/038 430/312 |
| 2006/0014106 A1 | 1/2006 | Hatakeyama et al. |
| 2006/0019195 A1 | 1/2006 | Hatakeyama et al. |
| 2006/0204891 A1 | 9/2006 | Hatakeyama |
| 2007/0122740 A1 | 5/2007 | Hatakeyama et al. |
| 2007/0238300 A1 | 10/2007 | Ogihara et al. |
| 2007/0275325 A1 | 11/2007 | Hatakeyama et al. |
| 2008/0118860 A1 | 5/2008 | Harada et al. |
| 2010/0099044 A1* | 4/2010 | Hatakeyama ........... G03F 7/095 430/285.1 |
| 2012/0077345 A1 | 3/2012 | Saito et al. |
| 2015/0228496 A1 | 8/2015 | Nakano |

FOREIGN PATENT DOCUMENTS

| | | |
|---|---|---|
| JP | H11-172414 A | 6/1999 |
| JP | 2004-205658 A | 7/2004 |
| JP | 2004-205676 A | 7/2004 |
| JP | 2004-205685 A | 7/2004 |
| JP | 2004-354554 A | 12/2004 |
| JP | 2005-010431 A | 1/2005 |
| JP | 2005-128509 A | 5/2005 |
| JP | 2005-250434 A | 9/2005 |
| JP | 2006-053543 A | 2/2006 |
| JP | 2006-227391 A | 8/2006 |
| JP | 2006-259249 A | 9/2006 |
| JP | 2006-259482 A | 9/2006 |
| JP | 2006-285095 A | 10/2006 |
| JP | 2006-293298 A | 10/2006 |
| JP | 2007-171895 A | 7/2007 |
| JP | 2007-199653 A | 8/2007 |
| JP | 2007-302873 A | 11/2007 |
| JP | 2007-316282 A | 12/2007 |
| JP | 2008-026600 A | 2/2008 |
| JP | 2008-096684 A | 4/2008 |
| JP | 2008-111103 A | 5/2008 |
| JP | 5336306 B2 | 11/2013 |
| JP | 2015-151575 A | 8/2015 |
| WO | 2010/147155 A1 | 12/2010 |

OTHER PUBLICATIONS

Lynch et al., "Properties and Performance of Near UV Reflectivity Control Layers". Proc of SPIE vol. 2195, pp. 225-229, 1994.

* cited by examiner

METHOD FOR FORMING MULTI-LAYER FILM AND PATTERNING PROCESS

TECHNICAL FIELD

The present invention relates to a method for forming a multi-layer film useful as a resist under layer film to be used for fine processing in the manufacturing process of a semiconductor device, etc., and to a patterning process using a multi-layer film formed by the method for forming a multi-layer film.

BACKGROUND ART

In recent years, as LSI (Large-Scale Integrated circuit) progresses toward high integration and high speed, a finer pattern rule is being requested. Under such circumstances, the lithography using a light exposure, which has been currently used as a general technology, is approaching the essential limit of resolution derived from the wavelength of a light source.

As the light source for lithography to be used for formation of a resist pattern, g-beam (436 nm) or i-beam (365 nm) of a mercury lamp, KrF excimer laser (248 nm), ArF excimer laser (193 nm), etc., have been widely used, and a double patterning has been investigated for finer patterning.

The double patterning is a technology that is capable of doubling the resolution of a resist, and further facilitate miniaturization of devices. Accompanying with the progress of miniaturization, a dry etching technology and a hard mask material each having high dimensional accuracy have been required. Also, needs for forming deep holes or grooves by dry etching has been heightened in manufacturing a 3-dimensional NAND memory or a capacitor of DRAM (Dynamic Random-Access Memory), etc. Under such a background, a hard mask excellent in etching resistance has been earnestly required.

On the other hand, to prevent a pattern collapse due to shrinkage of the size of a resist pattern, the thickness of the resist film has been thinned, and as a means to prevent the reduction in dry etching resistance due to the film-thinning, a multi-layer resist process has been used. The multi-layer process generally used in this case is a 3-layer (tri-layer) process in which a hydrocarbon film (hydrocarbon under layer film) is formed at a lower layer, an intermediate film containing silicon (silicon-containing intermediate film) is formed thereon, and a resist film is formed thereon. By providing antireflection effects to both of the silicon-containing intermediate film and the hydrocarbon under layer film, high antireflection effect can be obtained. In the age of a liquid immersion lithography in combination with a high NA (Numerical Aperture) lens, incidence angle of light to a substrate becomes shallow, so that reflection of the substrate is increased, and thus, an antireflection film having a high antireflection effect is required. Accordingly, the tri-layer process using a silicon-containing intermediate film and a hydrocarbon under layer film which have excellent antireflection effect was rapidly spread.

For carrying out the lithography for a fine pattern with a narrow focus margin, it is necessary to flatten the base material. In the case that a hydrocarbon under layer film and a silicon-containing intermediate film are formed by spin coating, there is a merit that the film surface can be flattened by a simple and easy process only of spin coating and baking, by applying a material excellent in embedding characteristics. However, these films formed by spin coating have a problem of insufficient dry etching resistance for double-patterning or digging deep holes or grooves.

Accordingly, a metal series film excellent in dry etching resistance has been investigated, and a hard mask, such as a silicon film and a titanium nitride film, formed by sputtering or CVD (Chemical Vapor Deposition) has been widely used. However, the hard mask formed by sputtering or CVD cannot flatten unevenness of the base material, so that it is necessary to flatten the film surface by grinding with CMP (Chemical-Mechanical Polishing) after film formation. In addition, sputtering and CVD require special devices, which increase the cost.

As the metal series film, a material for forming a metal oxide film by spin coating has been proposed, and a method in which a metal hard mask is formed under a photoresist film, a carbon film is formed thereunder, and a pattern is formed by tri-layer process is known (Non-Patent Document 1). Although the metal oxide film has an advantage to have excellent dry etching resistance compared to the silicon oxide film, it shows high absorbance of ArF light, and causes strong reflection from the metal oxide film. It also causes metal contamination of a spin coater when the metal oxide is applied by a spin coater.

In the case of forming the metal oxide film by spin coating, it is necessary to raise the baking temperature after spin coating to 250° C. or higher. At this time, if a usual hydrocarbon film is applied as an under layer film, it is thermally decomposed. Therefore, a hydrocarbon material having high heat resistance is required for the under layer film. As the material, there may be mentioned a novolac resin of fluorene bisnaphthol, and aldehyde condensates of carbazole or fluorenone (see Patent Documents 1 and 2).

It is also feasible that an under layer film with high heat resistance is formed by spin coating, and a hard mask such as a polysilicon hard mask is formed thereon. The polysilicon is a hard mask with excellent etching resistance. Forming a multi-layer film with 5 layers in total including two layers of antireflection films of a hydrocarbon film and a silicon oxide film formed on the polysilicon hard mask as well as a resist film formed on the antireflection films, it is possible to achieve excellent antireflection effect, to make the silicon oxide film thinner, and to have excellent etching selectivity in processing the substrate. This is excellent multi-layer constitution free from a risk to cause metal contamination, which have been generated in a method of forming a metal oxide film. On the other hand, since the polysilicon film is formed by sputtering at a substrate temperature of 500° C. or higher, this method subject the under layer film formed prior to the polysilicon film to be heated to 500° C. or higher. In heating at 500° C. or higher, there increases a risk of generating out gas from the film even if the under layer film can endure a temperature of 500° C.

In addition, in the tri-layer process, it has been proposed to form a negative pattern by development with an organic solvent. In this case, a margin for subjecting the silicon-containing intermediate film just below the resist to dry etching processing is insufficient since dry etching resistance of the resist film is markedly lowered under the influences both of remaining the film in which the cyclic protective group having etching resistance has been deprotected, and decreasing the film thickness due to the deprotection of the protective group. Thus, it has been investigated to make the silicon-containing intermediate film thin. At present, the film thickness of the silicon-containing intermediate film generally ranges from 30 to 40 nm. This has been determined by the reason that this range enables reflection of a substrate to be minimized, and the balance between the etching rate for transferring the pattern of the resist film and the etching rate for transferring the pattern of the silicon-containing intermediate film to the hydrocarbon film at the lower layer. On the other hand, to deal with insufficiency of dry etching resistance of the resist film, it is necessary to set the thickness of the silicon-containing intermediate film to 10 to 20 nm. However, when the silicon-containing intermediate film is thinned, two problems arise. One is that reflection of the substrate increases, which leads to the reduction in margin of the lithography. The other is that sufficient resistance cannot be secured for processing the hydrocarbon film at the lower layer by dry etching using the pattern of the silicon-containing intermediate film as a mask.

Also, considering the limit of semiconductor miniaturization, an increased capacity without depending on miniaturization is required in memory devices. In a flash memory, it has been investigated to increase the capacity by using a 3-dimensional memory in which memory cells are vertically laminated. In this case, a hole pattern is formed in the film having dozens of layers being laminated, and a gate electrode is embedded therein to form a transistor. In other words, it is required to form a fine hole by development with an organic solvent as mentioned above, and then perform a dry etching using the same to form a deep hole pattern. Accordingly, such processing requires a hard mask that has excellent etching resistance and is capable of transferring a negative pattern having low etching resistance and of deeply processing the laminated film.

As mentioned above, it is desired to develop a multi-layer film that can reduce reflection of the substrate to form a fine pattern and to process a laminated structure, and allows pattern formation with high dimensional accuracy in dry etching.

PRIOR ART DOCUMENTS

Patent Documents

Patent Document 1: Japanese Patent No. 5336306
Patent Document 2: International Patent Laid-Open Publication No. WO 2010/147155
Non-Patent Document 1: Proc. of SPIE Vol. 8682 86820S (2013)

SUMMARY OF INVENTION

The present invention has been accomplished in view of the circumstances, and an object thereof is to provide a method for forming a multi-layer film to be used as a resist under layer film in lithography, in which the method can give a multi-layer film that is capable of reducing reflectance and is useful for a patterning process with high dimensional accuracy in dry etching.

To achieve this object, the present invention provides a method for forming a multi-layer film on a substrate, comprising the steps of:
(i) forming an under layer film on the substrate by applying an under layer film material containing one or more species selected from the group consisting of resins having a repeating unit shown by the following general formula (1) in which a fluorene structure is contained, resins having a repeating unit shown by the following general formula (2) in which a fluorene structure is contained, and compounds shown by the following general formula (3) in which a fluorene structure is contained, and curing the same by heat treatment at a temperature of 300° C. or higher and 800° C. or lower for 10 to 4,000 seconds;
(ii) forming a titanium nitride film or a titanium oxynitride film on the under layer film;
(iii) forming a hydrocarbon film on the titanium nitride film or the titanium oxynitride film by applying a hydrocarbon film material; and
(iv) forming a silicon oxide film on the hydrocarbon film by applying a silicon oxide film material,

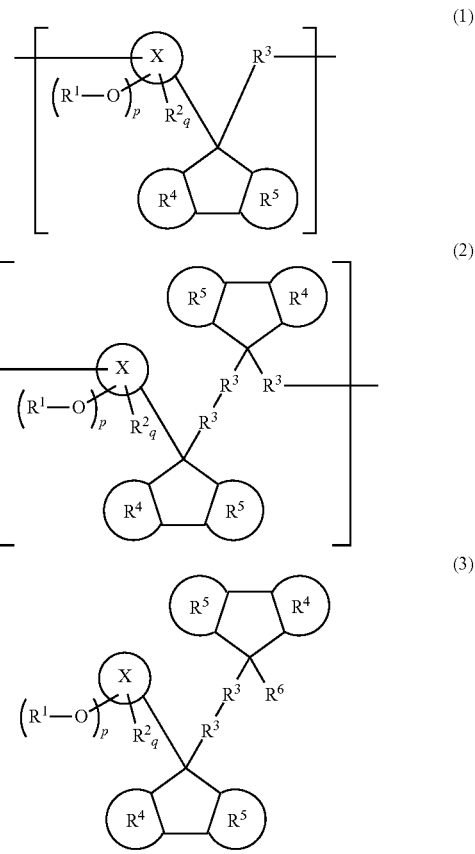

wherein X represents a benzene ring, a naphthalene ring, or a carbazole ring; $R^1$ represents a hydrogen atom, a glycidyl group, a linear, branched, or cyclic alkyl group having 1 to 10 carbon atoms, an aryl group having 6 to 20 carbon atoms, an alkenyl group having 2 to 20 carbon atoms, or an alkynyl group having 2 to 20 carbon atoms; $R^2$ represents a hydrogen atom, a linear, branched, or cyclic alkyl group having 1 to 10 carbon atoms, an aryl group having 6 to 10 carbon atoms, an alkenyl group having 2 to 6 carbon atoms, or an alkynyl group having 2 to 6 carbon atoms; each $R^3$ independently represents a single bond, a carbazole ring, an alkylene group having 1 to 20 carbon atoms, an alkenylene group having 2 to 20 carbon atoms, or an arylene group having 6 to 20 carbon atoms, and optionally contains one or more groups selected from an ether group, an ester group, a hydroxy group, a carboxy group, a glycidyloxy group, an alkyl group having 1 to 10 carbon atoms, an aryl group having 6 to 10 carbon atoms, an alkeny group having 2 to 6 carbon atoms, an alkyny group having 2 to 6 carbon atoms, an alkoxy group having 1 to 10 carbon atoms, an aryloxy group having 6 to 20 carbon atoms, an alkenyloxy group having 2 to 20 carbon atoms, and an alkynyloxy group having 2 to 20 carbon atoms; $R^4$ and $R^5$ independently represent a benzene ring or a naphthalene ring, and a hydrogen atom(s) in the benzene ring or the naphthalene ring is/are optionally substituted by a hydrocarbon group having 1 to 6 carbon atoms; $R^6$ represents a hydrogen atom, an alkyl group having 1 to 20 carbon atoms, an alkenyl group having 2 to 6 carbon atoms, an alkynyl group having 2 to 6 carbon atoms, or an aryl group having 6 to 10 carbon atoms, and when $R^6$ is an aryl group, a hydrogen atom(s) in the aryl group is/are optionally substituted by a hydroxy group, a carboxy group, a halogen atom, a glycidyloxy group, an alkyl group having 1 to 10 carbon atoms, an aryl group having 6 to 10 carbon atoms, an alkeny group having 2 to 6 carbon atoms, an alkyny group having 2 to 6 carbon atoms, an alkoxy group having 1 to 10 carbon atoms, an aryloxy group having 6 to 20 carbon atoms, an alkenyloxy group having 2 to 20 carbon atoms, or an alkynyloxy group having 2 to 20 carbon atoms; and "p" and "q" independently represent an integer of 0 to 2.

When such a method for forming a multi-layer film is employed, a multi-layer film that is capable of reducing reflectance and is useful for a patterning process with high dimensional accuracy in dry etching can be formed.

It is preferred that applying of the materials in the steps (i), (iii), and (iv) be carried out by a spin coating method.

The spin coating method enables an under layer film, a hydrocarbon film, and a silicon oxide film each having a highly flat surface to be formed by a simple and easy process. This can also reduce the cost compared with a method for forming these films by sputtering method or a CVD method.

It is preferred that forming of the titanium nitride film or the titanium oxynitride film in the step (ii) be carried out by a sputtering method or a CVD method.

The sputtering method or the CVD method can easily form the titanium nitride film or the titanium oxynitride film.

It is preferred that the under layer film having a film thickness of 30 to 20,000 nm be formed in the step (i), the titanium nitride film or the titanium oxynitride film having a film thickness of 3 to 100 nm be formed in the step (ii), the hydrocarbon film having a film thickness of 5 to 100 nm be formed in the step (iii), and the silicon oxide film having a film thickness of 10 to 20 nm be formed in the step (iv).

By making each layer such a film thickness, reflectance can be further reduced, and dimensional accuracy of dry etching can be further enhanced.

The present invention also provides a patterning process comprising the steps of:
(A) forming a photoresist film on the multi-layer film which has been formed on the substrate by the foregoing method for forming a multi-layer film;
(B) forming a photoresist pattern by subjecting the photoresist film to exposure and development;
(C) transferring the pattern to the silicon oxide film by dry etching using the photoresist pattern as a mask;
(D) transferring the pattern to the hydrocarbon film by dry etching using the silicon oxide film to which the pattern has been transferred as a mask;
(E) transferring the pattern to the titanium nitride film or the titanium oxynitride film by dry etching using the hydrocarbon film to which the pattern has been transferred as a mask;
(F) transferring the pattern to the under layer film by dry etching using the titanium nitride film or the titanium oxynitride film to which the pattern has been transferred as a mask; and
(G) transferring the pattern to the substrate by dry etching using the titanium nitride film or the titanium oxynitride film and the under layer film to which the pattern has been transferred as a mask.

Such a patterning process can reduce reflectance, and can enhance dimensional accuracy of dry etching.

In this case, it is preferred that the dry etching in the step (F) be carried out by using one or more etching gases selected from an oxygen gas, a hydrogen gas, an ammonia gas, a carbon dioxide gas, a carbon monoxide gas, and a sulfur dioxide gas.

By using such etching gases, the pattern can be efficiently transferred to the under layer film by dry etching.

As mentioned above, the method for forming a multi-layer film of the present invention can form a multi-layer film that can be suitably used as a resist under layer film in the lithography, has an optimum n value and k value and embedding characteristics as an antireflection film, and further has excellent etching resistance. In addition, according to the patterning process of the present invention using such a multi-layer film, a pattern may be formed by a 5-layer (penta-layer) process using a photoresist film and the multi-layer film having the above-mentioned characteristics, so that, in particular, even when a negative tone resist pattern developed by an organic solvent which is thin and vulnerable in dry etching resistance is used, the pattern can be transferred with high accuracy. Further, by using a material having high heat resistance to form the under layer film by the spin coating method, the under layer film can endure a high temperature baking treatment when a titanium nitride film or a titanium oxynitride film (inorganic hard mask) is formed thereon. Thus, it is possible to provide a highly-accurate and low-cost patterning process combining an under layer film obtained by the spin coating method and a titanium nitride film or a titanium oxynitride film (inorganic hard mask), which has excellent dry etching resistance.

DESCRIPTION OF EMBODIMENTS

As mentioned above, the patterning process using a multi-layer resist film that has a tri-layer structure exhibits more excellent pattern transfer precision than methods using a single layer resist film or using an organic antireflection film laid under the resist film, but thinning of the resist film accompanied by the progress of miniaturization and reduction in dry etching resistance of the resist film cause a problem of lowering of pattern transfer precision even when the tri-layer process is employed. Thus, it has been desired to construct a method for forming a multi-layer film that can heighten pattern transfer precision, and a patterning process using the same.

Figure 3:
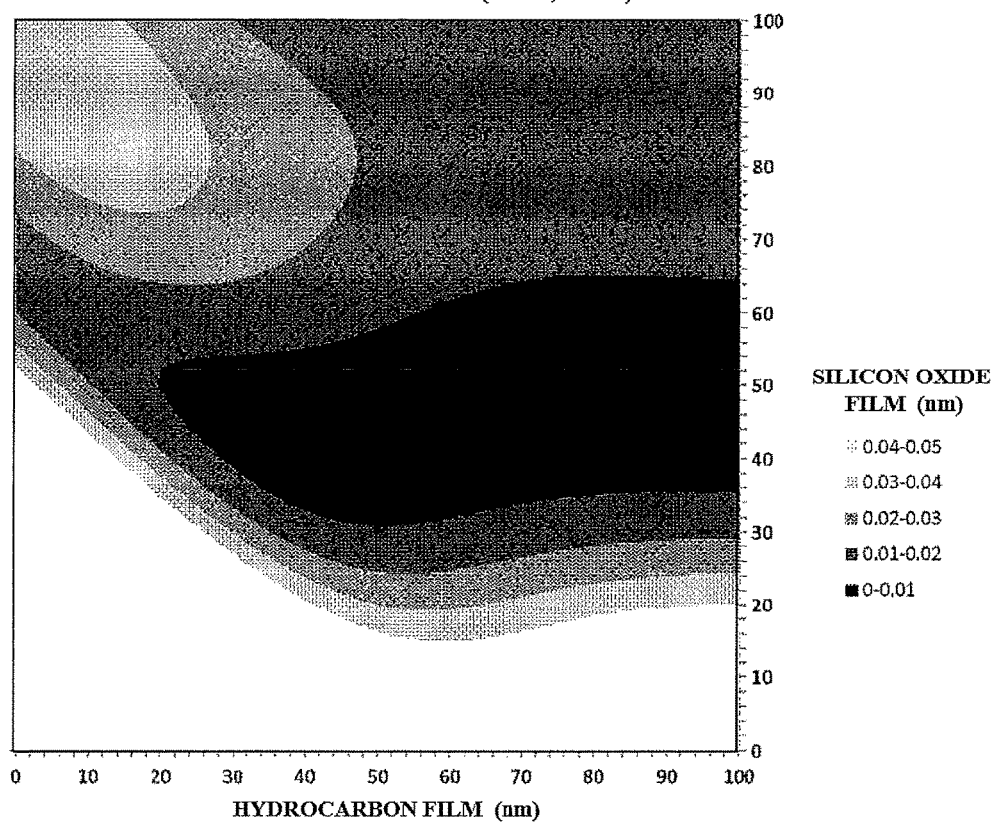
FIG. 3 is a graph showing the reflectance of the substrate when the respective film thicknesses of a silicon oxide film (n value=1.6, k value=0.2) and a hydrocarbon film (n value=1.4, k value=0.4) are changed in the range of 0 to 100 nm at a wavelength of 193 nm, NA=1.35, using dipole illumination in the 3-layer process.

FIG. 3 shows reflectance of a silicon substrate for tri-layer process that has a resist film, a silicon oxide film (n value=1.6, k value=0.2) placed under the resist film, and a hydrocarbon film (n value=1.4, k value=0.4) placed under the silicon oxide film, when film thickness of the hydrocarbon film and the silicon oxide film are changed. At this time, liquid immersion lithography with a wavelength of 193 nm and dipole illumination of NA=1.35 as an optical illumination is employed. Also, gradations in the graph show that denser the color is, the lower the reflectance of the substrate is. From FIG. 3, it can be understood that, in the case of tri-layer process, if the film thickness of the silicon oxide film is in the range of 35 to 60 nm, there exist a black region where the reflectance is 1% or less regardless of the film thickness of the hydrocarbon film, whereas if the silicon oxide film is set to 35 nm or less, reflection of the substrate increases. From these results, it can be understood that reduction of the reflectance and film-thinning of the silicon oxide film cannot be achieved simultaneously in the tri-layer process.

In the case of a tri-layer composed of a resist film, a silicon oxide film, and a hydrocarbon film, it is necessary to make reflection of the substrate constant by filling unevenness of the substrate even when the film thickness of the hydrocarbon film is changed. Therefore, a thick layer region at which reflection of the substrate is constant even when the film thickness of the hydrocarbon film is changed is used, and further, a material having high absorption (i.e., having a large k value) is selected so that reflection of the substrate becomes constant. From the viewpoint of suppressing reflection alone, the optimum k value of the hydrocarbon film is 0.2 to 0.3, but according to this value, absorption is not sufficient, and reflection of the substrate increases or decreases depending on the effect of fluctuations in film thickness of the hydrocarbon film. For the above reasons, a material having a k value of 0.4 or more is used for the tri-layer process. However, in this case, if the film thickness of the silicon oxide film is thinned to 20 nm or less, the problem occurs that reflection increases.

Also, a resist pattern obtained by negative development has extremely low etching resistance under the influences of thinning the resist film thickness accompanied by the progress of miniaturization, and shrink of the film thickness due to deprotection of a cyclic protective group that improves etching resistance. It has been investigated to make the silicon oxide film just below the resist film thin to transfer the resist pattern having extremely low etching resistance. However, in the case of the tri-layer process, a thinned silicon oxide film causes the increase in reflection of the substrate as mentioned above, so that there is a problem that a margin of lithography is lowered.

Figure 4:
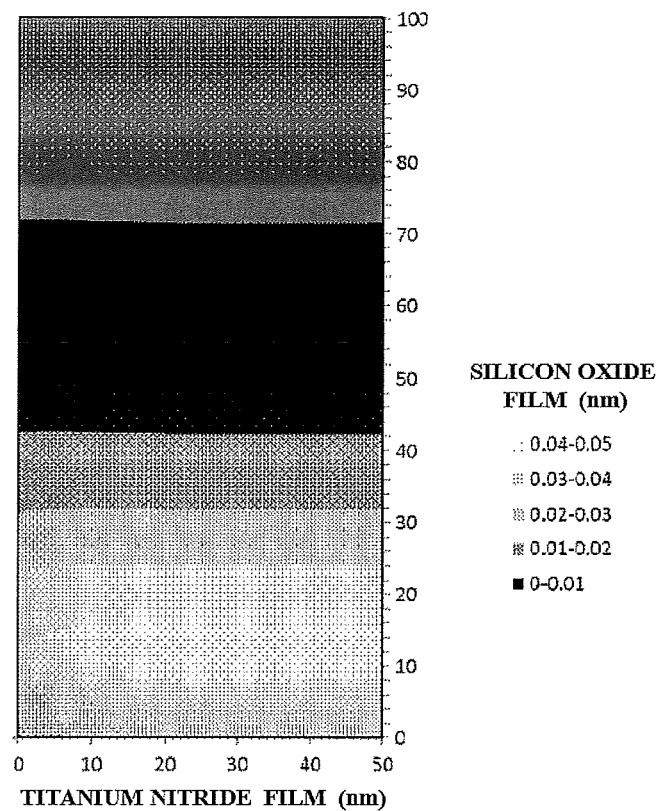
FIG. 4 is a graph showing the reflectance of the substrate when an under layer film (n value=1.4, k value=0.4; film thickness: 100 nm) is used, and the film thicknesses of a silicon oxide film (n value=1.6, k value=0.2) is changed in the range of 0 to 100 nm and the film thicknesses of a titanium nitride film (n value=2.1, k value=1.5) is changed in the range of 0 to 50 nm at a wavelength of 193 nm, NA=1.35, using dipole illumination in the 4-layer process.

FIG. 4 shows reflectance of a silicon substrate for tetra-layer process that has a resist film, a silicon oxide film (n value=1.6, k value=0.2) placed under the resist film, a titanium nitride film (n value=2.1, k value=1.5) placed under the silicon oxide film, and an under layer film (n value=1.4, k value=0.4; film thickness: 100 nm) placed under the titanium nitride film, when film thicknesses of the silicon oxide film and the titanium nitride film are changed. The titanium nitride film has high n value and k value as well as large reflection. Accordingly, when the film formed thereon is only one layer of the silicon oxide film, it is not possible to suppress the reflection unless the film thickness of the silicon oxide film is 40 nm or more as shown in FIG. 4. This reveals that both of reduction of the reflectance and film-thinning of the silicon oxide film cannot be achieved simultaneously in the tetra-layer process. When the silicon oxide film is thick, the resist pattern thereon is subjected to heavy load in dry etching. In order to reduce the load onto a resist pattern in dry etching, a thinner silicon oxide film is preferable.

To solve these problems, the present inventors have focused an attention on pattern formation by a penta-layer process.

Figure 5:
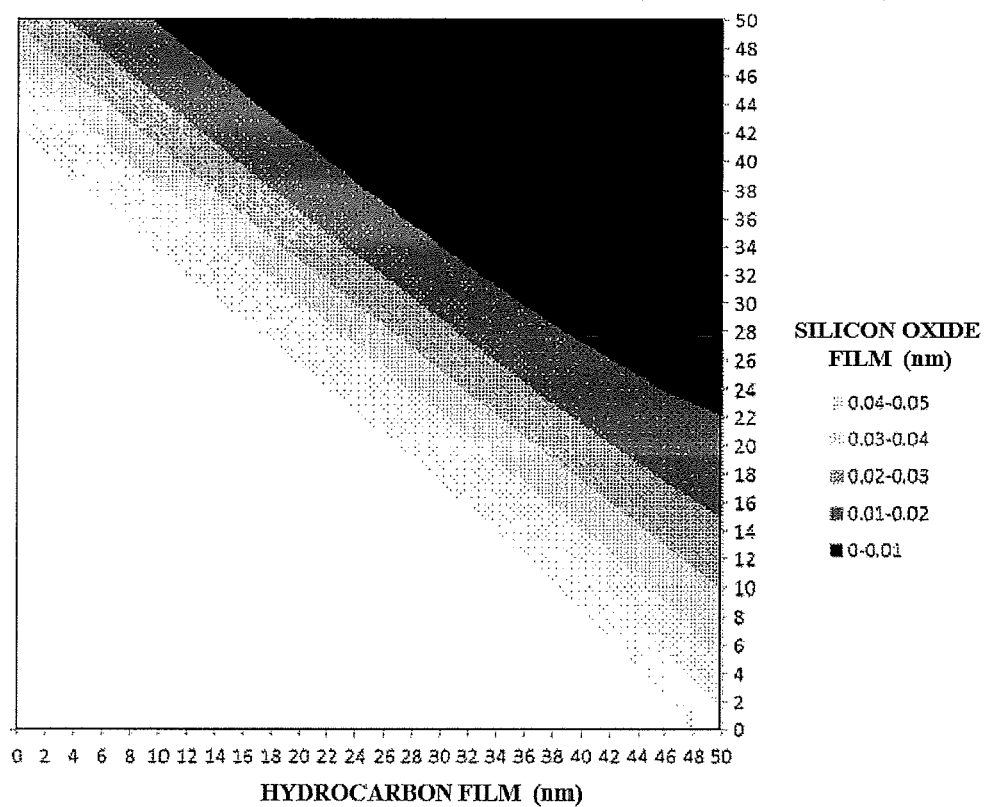
FIG. 5 is a graph showing the reflectance of the substrate when an under layer film (n value=1.4, k value=0.4; film thickness: 100 nm) and a titanium nitride film (n value=2.1, k value=1.5; film thickness 30 nm) are used, and the respective film thicknesses of a silicon oxide film (n value=1.6, k value=0.2) and a hydrocarbon film (n value=1.5, k value=0.3) are changed in the range of 0 to 50 nm at a wavelength of 193 nm, NA=1.35, using dipole illumination in the 5-layer process.

FIG. 5 shows reflectance of a silicon substrate for penta-layer process that has a resist film, a silicon oxide film (n value=1.6, k value=0.2) placed under the resist film, a hydrocarbon film (n value=1.5 and k value=0.3) placed under the silicon oxide film, a titanium nitride film (n value=2.1, k value=1.5; film thickness 30 nm) placed under the hydrocarbon film, and an under layer film (n value=1.4, k value=0.4; film thickness: 100 nm) placed under the titanium nitride film, when film thicknesses of the hydrocarbon film and the silicon oxide film are changed. The titanium oxide film has an extremely large absorption at a wavelength of 193 nm and a high n value, and exhibits high reflectance. From FIG. 5, it can be understood that, in the case of the penta-layer process, there exist a region which gives reflection of the substrate of 1% or less even when the film thickness of the silicon oxide film is thinned to about 24 nm. From these results, it can be understood that both of reduction of the reflectance and film-thinning of the silicon oxide film can be achieved simultaneously in the penta-layer process.

Figure 6:
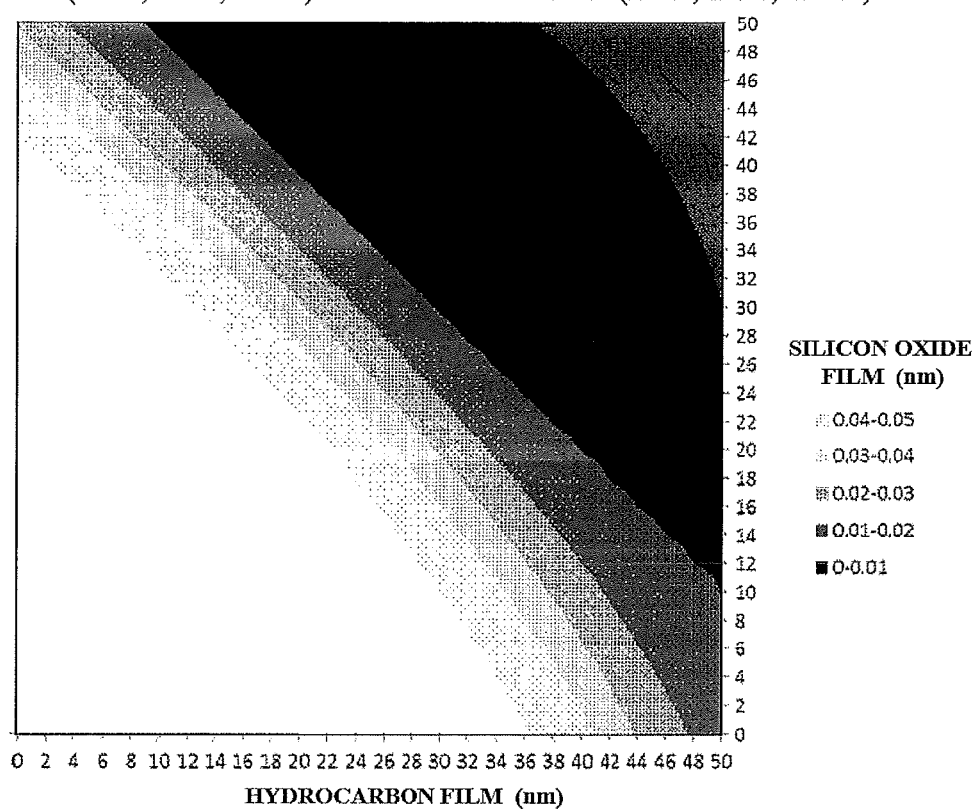
FIG. 6 is a graph showing the reflectance of the substrate when an under layer film (n value=1.4, k value=0.4; film thickness 100 nm) and a titanium nitride film (n value=2.1, k value=1.5; film thickness 30 nm) are used, and the respective film thicknesses of a silicon oxide film (n value=1.6, k value=0.2) and a hydrocarbon film (n value=1.6, k value=0.3) are changed in the range of 0 to 50 nm at a wavelength of 193 nm, NA=1.35, using dipole illumination in the 5-layer process.
Figure 7:
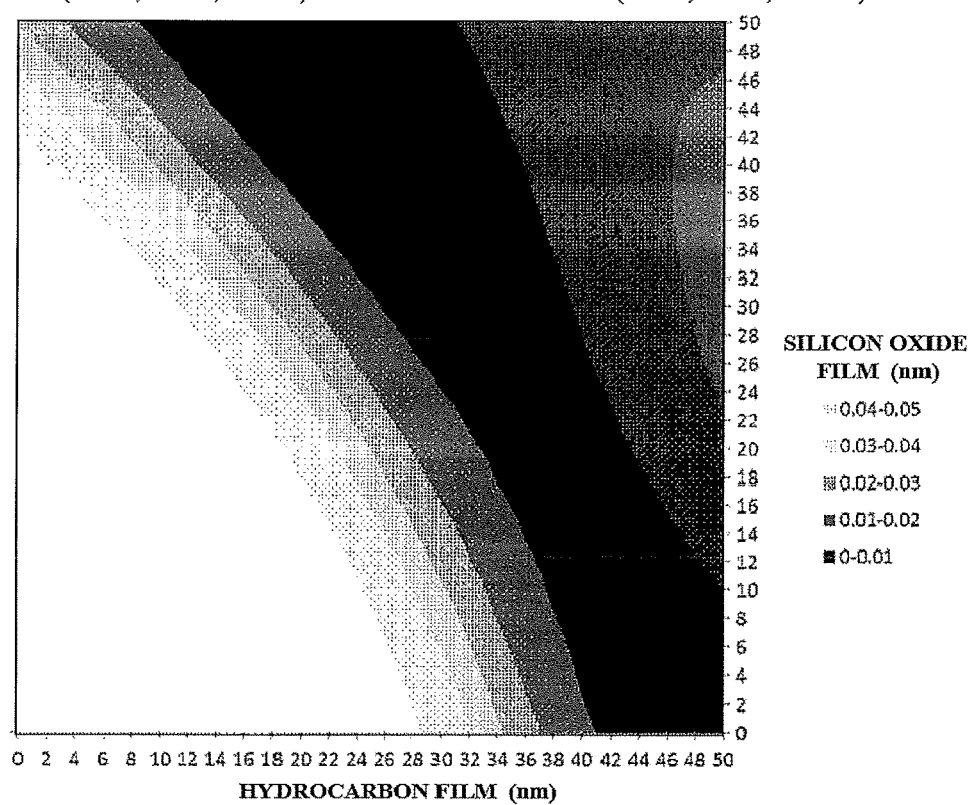
FIG. 7 is a graph showing the reflectance of the substrate when an under layer film (n value=1.4, k value=0.4; film thickness 100 nm) and a titanium nitride film (n value=2.1, k value=1.5; film thickness 30 nm) are used, and the respective film thicknesses of a silicon oxide film (n value=1.6, k value=0.2) and a hydrocarbon film (n value=1.7, k value=0.3) are changed in the range of 0 to 50 nm at a wavelength of 193 nm, NA=1.35, using dipole illumination in the 5-layer process.

Further, FIG. 6 shows reflectance of the above-mentioned substrate for penta-layer process in which the n value of the hydrocarbon film is heightened (n value=1.6, k value=0.3), and FIG. 7 shows reflectance of the above-mentioned substrate for penta-layer process in which the n value of the hydrocarbon film is further heightened (n value=1.7, k value=0.3). From FIGS. 6 and 7, it can be understood that if the n value of the hydrocarbon film is heightened in the penta-layer process, it is possible to suppress reflection of the substrate even when the silicon oxide film is further thinned.

From the above facts, the present inventors have found that, when embedding and flattening of the substrate is carried out by an under layer film, and then a titanium nitride film or a titanium oxynitride film is formed thereon, light is totally reflected on the titanium nitride film or the titanium oxynitride film, but an antireflection film (a hydrocarbon film and a silicon oxide film) applied thereon does not change the reflectance even when the film thickness is changed because the base material has already been flattened, so that a film thickness that gives the exactly minimum reflection can be selected. Also, they have found that selecting a hydrocarbon film material having a high n value allows thinning of the film thickness of the silicon oxide film.

Besides, in the conventional patterning process by the tri-layer process, when an amorphous carbon film is formed at a lower layer, and a hard mask that also functions as an antireflection film, such as SiON, is formed thereon, the SiON hard mask shows excellent etching resistance to the amorphous carbon film formed at the lower layer, and the amorphous carbon film also shows excellent dry etching resistance to the substrate to be processed that is positioned thereunder. This is a firm combination in view of dry etching resistance. The formation of the amorphous carbon film is generally performed by CVD method, however, unevenness of the substrate used as a substrate to be processed cannot be flattened by the CVD method, so that it is necessary to plane the surface of the amorphous carbon film by the CMP method to flatten the substrate surface. That is, there arises the problem that the processing cost is increased by applying the CMP process.

On the other hand, for forming a flat carbon film surface, spin coating is effective. In this case, a carbon film having a flat surface can be formed by the simple and easy process of applying and baking, so that throughput thereof is high and the cost is low. That is, in the present invention, it is effective to form an under layer film by spin coating for embedding and flattening of the substrate by the under layer film.

Further, as mentioned above, the titanium nitride film or the titanium oxynitride film is formed on the under layer film by sputtering method or a CVD method, and raising the substrate temperature to 300° C. or higher in the film formation, whereby a firm titanium nitride film or titanium oxynitride film is formed. Accordingly, the coating type under layer film that is used as a base material of the titanium nitride film or the titanium oxynitride film in the present invention requires high heat resistance of 300° C. or higher. The present inventors have conceived to use a resin that has a repeating unit containing a specific fluorene structure or a compound that contains a specific fluorene structure as the under layer film material having such a high heat resistance, thereby brought the present invention completion.

That is, the present invention is a method for forming a multi-layer film on a substrate, comprising the steps of:
(i) forming an under layer film on the substrate by applying an under layer film material containing one or more species selected from the group consisting of resins having a repeating unit shown by the following general formula (1) in which a fluorene structure is contained, resins having a repeating unit shown by the following general formula (2) in which a fluorene structure is contained, and compounds shown by the following general formula (3) in which a fluorene structure is contained, and curing the same by heat treatment at a temperature of 300° C. or higher and 800° C. or lower for 10 to 4,000 seconds;
(ii) forming a titanium nitride film or a titanium oxynitride film on the under layer film;
(iii) forming a hydrocarbon film on the titanium nitride film or the titanium oxynitride film by applying a hydrocarbon film material; and
(iv) forming a silicon oxide film on the hydrocarbon film by applying a silicon oxide film material,

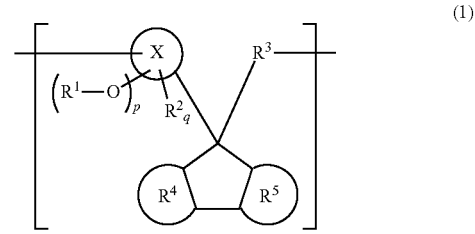

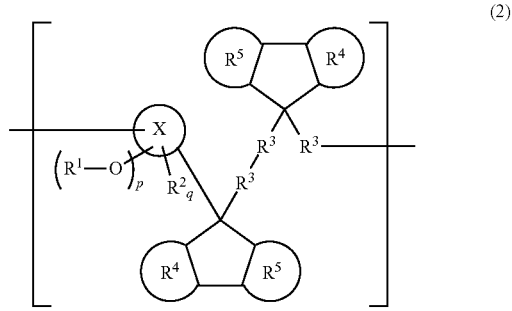

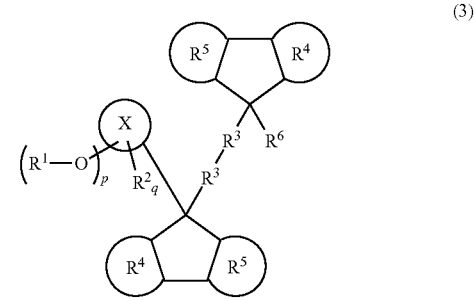

wherein X represents a benzene ring, a naphthalene ring, or a carbazole ring; $R^1$ represents a hydrogen atom, a glycidyl group, a linear, branched, or cyclic alkyl group having 1 to 10 carbon atoms, an aryl group having 6 to 20 carbon atoms, an alkenyl group having 2 to 20 carbon atoms, or an alkynyl group having 2 to 20 carbon atoms; $R^2$ represents a hydrogen atom, a linear, branched, or cyclic alkyl group having 1 to 10 carbon atoms, an aryl group having 6 to 10 carbon atoms, an alkenyl group having 2 to 6 carbon atoms, or an alkynyl group having 2 to 6 carbon atoms; each $R^3$ independently represents a single bond, a carbazole ring, an alkylene group having 1 to 20 carbon atoms, an alkenylene group having 2 to 20 carbon atoms, or an arylene group having 6 to 20 carbon atoms, and optionally contains one or more groups selected from an ether group, an ester group, a hydroxy group, a carboxy group, a glycidyloxy group, an alkyl group having 1 to 10 carbon atoms, an aryl group having 6 to 10 carbon atoms, an alkeny group having 2 to 6 carbon atoms, an alkyny group having 2 to 6 carbon atoms, an alkoxy group having 1 to 10 carbon atoms, an aryloxy group having 6 to 20 carbon atoms, an alkenyloxy group having 2 to 20 carbon atoms, and an alkynyloxy group having 2 to 20 carbon atoms; $R^4$ and $R^5$ independently represent a benzene ring or a naphthalene ring, and a hydrogen atom(s) in the benzene ring or the naphthalene ring is/are optionally substituted by a hydrocarbon group having 1 to 6 carbon atoms; $R^6$ represents a hydrogen atom, an alkyl group having 1 to 20 carbon atoms, an alkenyl group having 2 to 6 carbon atoms, an alkynyl group having 2 to 6 carbon atoms, or an aryl group having 6 to 10 carbon atoms, and when $R^6$ is an aryl group, a hydrogen atom(s) in the aryl group is/are optionally substituted by a hydroxy group, a carboxy group, a halogen atom, a glycidyloxy group, an alkyl group having 1 to 10 carbon atoms, an aryl group having 6 to 10 carbon atoms, an alkeny group having 2 to 6 carbon atoms, an alkyny group having 2 to 6 carbon atoms, an alkoxy group having 1 to 10 carbon atoms, an aryloxy group having 6 to 20 carbon atoms, an alkenyloxy group having 2 to 20 carbon atoms, or an alkynyloxy group having 2 to 20 carbon atoms; and "p" and "q" independently represent an integer of 0 to 2.

Hereinafter, the method for forming a multi-layer film of the present invention will be explained in detail, but the present invention is not limited thereto.

Method for Forming a Multi-Layer Film

Figure 1:
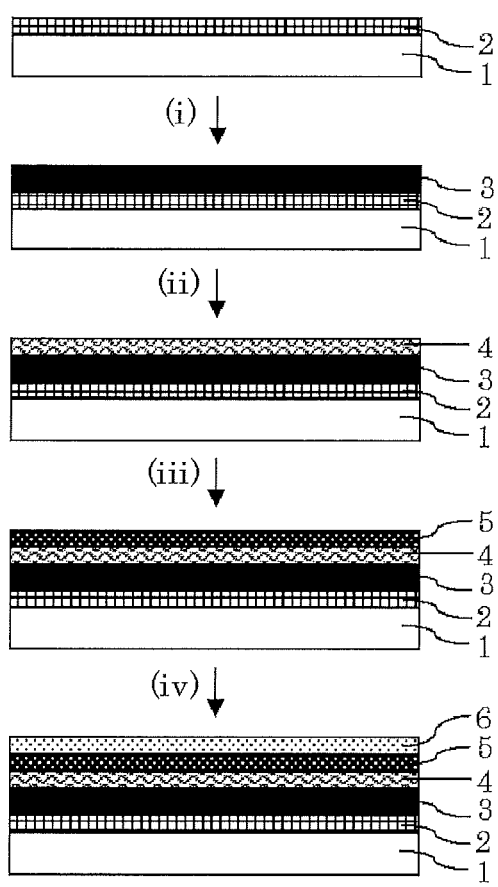
FIG. 1 is a flow chart showing an example of the method for forming a multi-layer film of the present invention.

FIG. 1 is a flow chart showing an example of the method for forming a multi-layer film of the present invention. The method for forming a multi-layer film in FIG. 1, (i) an under layer film material is applied onto a layer to be processed 2 which has been formed on a substrate 1, and cured by heat treatment at a temperature of 300° C. or higher and 800° C. or lower for 10 to 4,000 seconds to form an under layer film 3, (ii) a titanium nitride film 4 (or a titanium oxynitride film) is formed onto the under layer film 3 by sputtering method or a CVD method, for example, (iii) a hydrocarbon film material is applied onto the titanium nitride film 4 (or the titanium oxynitride film) to form a hydrocarbon film 5, and (iv) a silicon oxide film material is applied onto the hydrocarbon film 5 to form a silicon oxide film 6, whereby a multi-layer film is formed onto the substrate 1 (the layer to be processed 2).

Hereinafter, each step of the method for forming a multi-layer film of the present invention is explained in more detail.

Step (i)

In the step (i) of the method for forming a multi-layer film of the present invention, a substrate is coated with an under layer film material containing one or more species selected from the group consisting of resins having a repeating unit shown by the general formula (1) in which a fluorene structure is contained, resins having a repeating unit shown by the general formula (2) in which a fluorene structure is contained, and compounds shown by the general formula (3) in which a fluorene structure is contained, and this is cured by heat treatment at a temperature of 300° C. or higher and 800° C. or lower for 10 to 4,000 seconds to form an under layer film.

Substrate (Substrate to be Processed)

As the substrate (the substrate to be processed) to be used in the method for forming a multi-layer film of the present invention, a substrate on which a layer to be processed is formed is preferably used. The substrate is not particularly limited, and a material comprising Si, α-Si, p-Si, $SiO_2$, SiN, SiON, W, TiN, Al, etc., and a material different from that of the layer to be processed is suitably used. As the layer to be processed, various kinds of low-k films such as Si, $SiO_2$, SiON, SiN, p-Si, α-Si, W, W—Si, Al, Cu, Al—Si, etc., and its stopper film are suitably used. The layer may be generally formed with a thickness of 50 to 10,000 nm, in particular, 100 to 5,000 nm.

Under Layer Film

The under layer film material to be used in the method for forming a multi-layer film of the present invention contains one or more species selected from the group consisting of resins having a repeating unit shown by the following general formula (1) in which a fluorene structure is contained, resins having a repeating unit shown by the following general formula (2) in which a fluorene structure is contained, and compounds shown by the following general formula (3) in which a fluorene structure is contained. By containing such a resin or a compound that has a repeating unit containing a fluorene structure, an under layer film excellent in heat resistance and etching resistance can be formed.

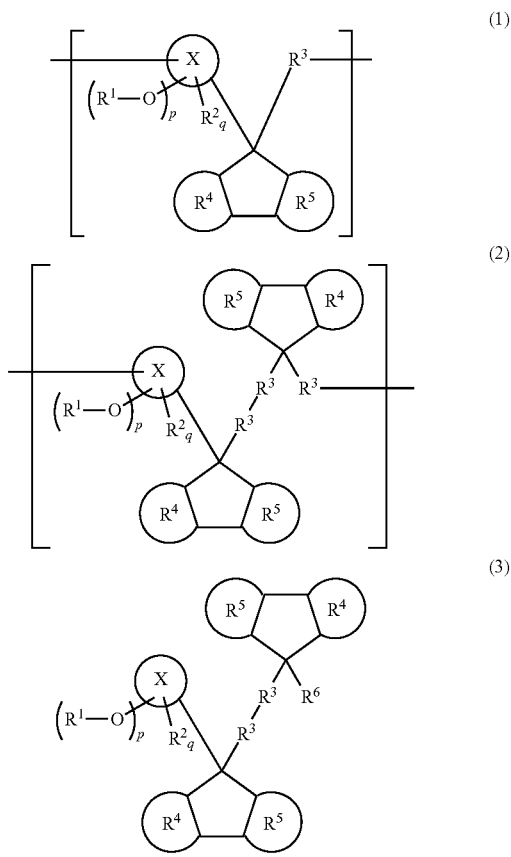

wherein X represents a benzene ring, a naphthalene ring, or a carbazole ring; $R^1$ represents a hydrogen atom, a glycidyl group, a linear, branched, or cyclic alkyl group having 1 to 10 carbon atoms, an aryl group having 6 to 20 carbon atoms, an alkenyl group having 2 to 20 carbon atoms, or an alkynyl group having 2 to 20 carbon atoms; $R^2$ represents a hydrogen atom, a linear, branched, or cyclic alkyl group having 1 to 10 carbon atoms, an aryl group having 6 to 10 carbon atoms, an alkenyl group having 2 to 6 carbon atoms, or an alkynyl group having 2 to 6 carbon atoms; each $R^3$ independently represents a single bond, a carbazole ring, an alkylene group having 1 to 20 carbon atoms, an alkenylene group having 2 to 20 carbon atoms, or an arylene group having 6 to 20 carbon atoms, and optionally contains one or more groups selected from an ether group, an ester group, a hydroxy group, a carboxy group, a glycidyloxy group, an alkyl group having 1 to 10 carbon atoms, an aryl group having 6 to 10 carbon atoms, an alkeny group having 2 to 6 carbon atoms, an alkyny group having 2 to 6 carbon atoms, an alkoxy group having 1 to 10 carbon atoms, an aryloxy group having 6 to 20 carbon atoms, an alkenyloxy group having 2 to 20 carbon atoms, and an alkynyloxy group having 2 to 20 carbon atoms; $R^4$ and $R^5$ independently represent a benzene ring or a naphthalene ring, and a hydrogen atom(s) in the benzene ring or the naphthalene ring is/are optionally substituted by a hydrocarbon group having 1 to 6 carbon atoms; $R^6$ represents a hydrogen atom, an alkyl group having 1 to 20 carbon atoms, an alkenyl group having 2 to 6 carbon atoms, an alkynyl group having 2 to 6 carbon atoms, or an aryl group having 6 to 10 carbon atoms, and when $R^6$ is an aryl group, a hydrogen atom(s) in the aryl group is/are optionally substituted by a hydroxy group, a carboxy group, a halogen atom, a glycidyloxy group, an alkyl group having 1 to 10 carbon atoms, an aryl group having 6 to 10 carbon atoms, an alkeny group having 2 to 6 carbon atoms, an alkyny group having 2 to 6 carbon atoms, an alkoxy group having 1 to 10 carbon atoms, an aryloxy group having 6 to 20 carbon atoms, an alkenyloxy group having 2 to 20 carbon atoms, or an alkynyloxy group having 2 to 20 carbon atoms; and "p" and "q" independently represent an integer of 0 to 2.

The under layer film material contains:
(I) one or more species selected from the group consisting of the resins having a repeating unit shown by the foregoing general formula (1) in which a fluorene structure is contained, the resins having a repeating unit shown by the foregoing general formula (2) in which a fluorene structure is contained, and the compounds shown by the foregoing general formula (3) in which a fluorene structure is contained, as an essential component, and generally contains
(II) an organic solvent, and may further contain
(III) a polymer or a monomer for blend (polymer or monomer other than the foregoing (I)),
(IV) a crosslinking agent,
(V) an acid generator, etc., if necessary, for improving spin coating characteristics, embedding characteristics to a stepped substrate, and rigidity or solvent resistance of the film.

In each of the resin having a repeating unit shown by the general formula (1) in which a fluorene structure is contained, the resin having a repeating unit shown by the general formula (2) in which a fluorene structure is contained, and the compound shown by the general formula (3) in which a fluorene structure is contained, a structure such as fluorene phenol, fluorene naphthol, and fluorene carbazole is contained. As the resin having a repeating unit shown by the general formula (1) in which a fluorene structure is contained, it is preferable to use a resin having a repeating unit which contains a structure such as fluorene bisphenol and fluorene bisnaphthol, in particular, a resin having a repeating unit which contains a novolac structure obtained by reacting a fluorene bisphenol compound or a fluorene bisnaphthol compound in the presence of aldehydes. Alternatively, the repeating unit may contain a structure having two fluorene as shown by the general formula (2).

The repeating unit represented by the general formula (1) or (2) in which a fluorene structure is contained may be exemplified by the following.

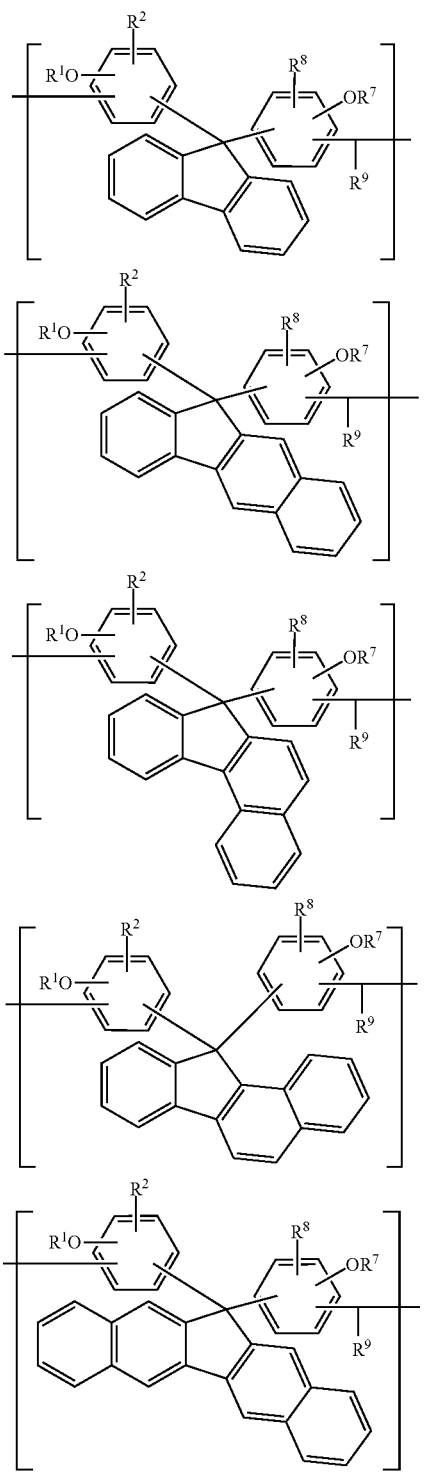

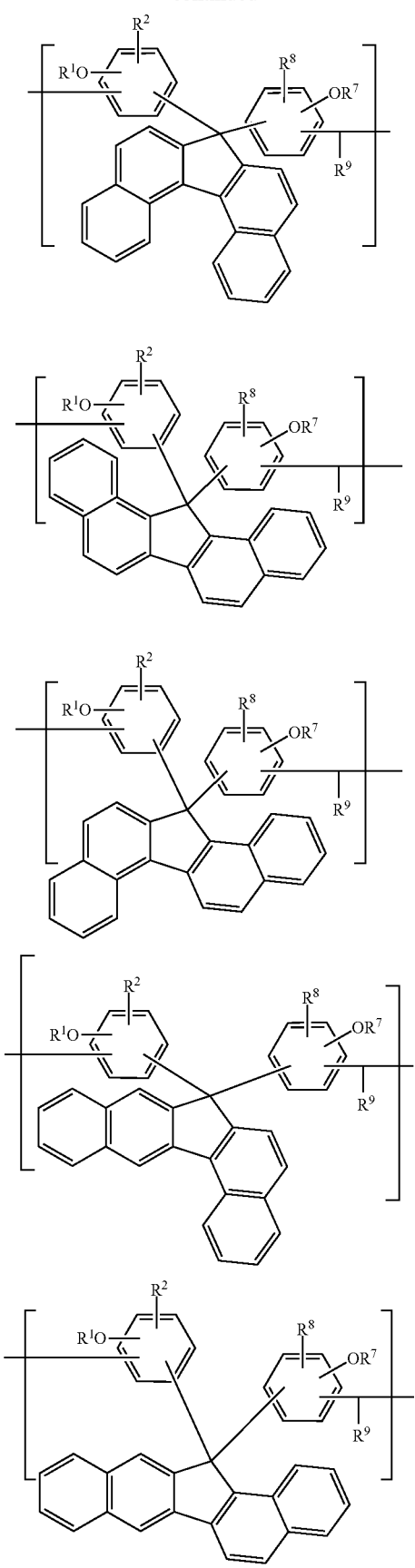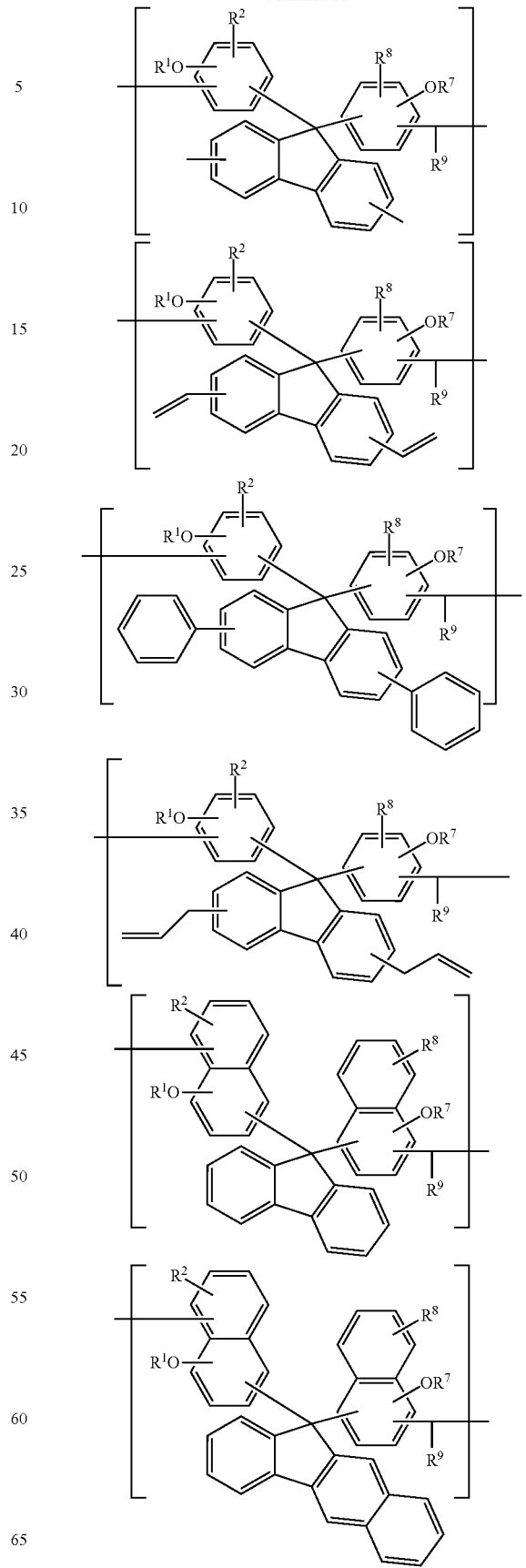

-continued
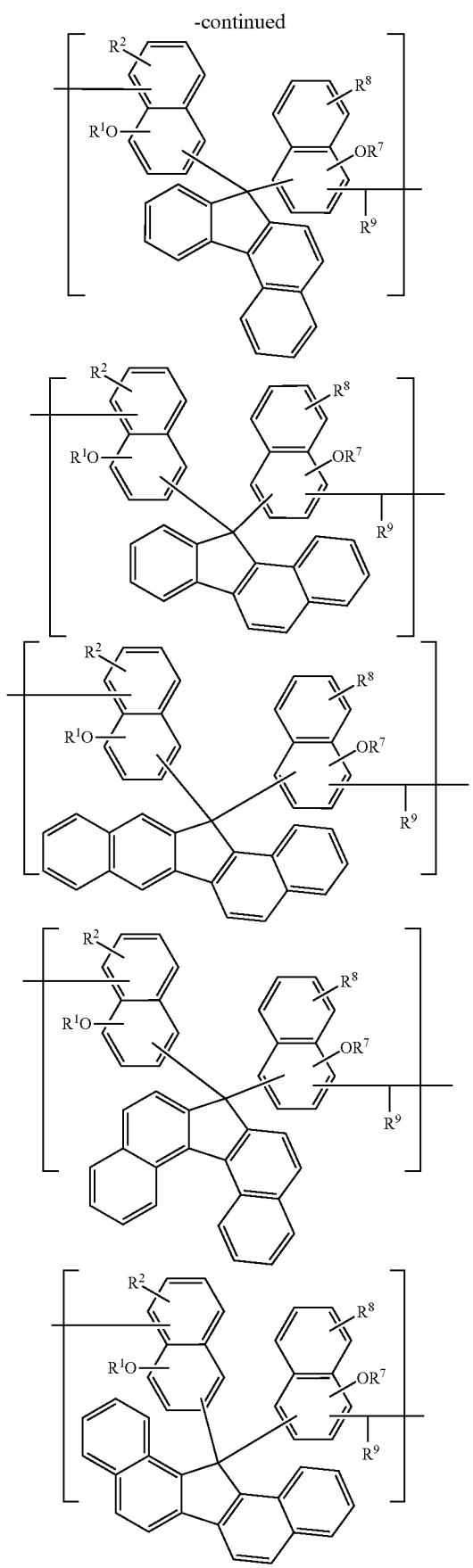
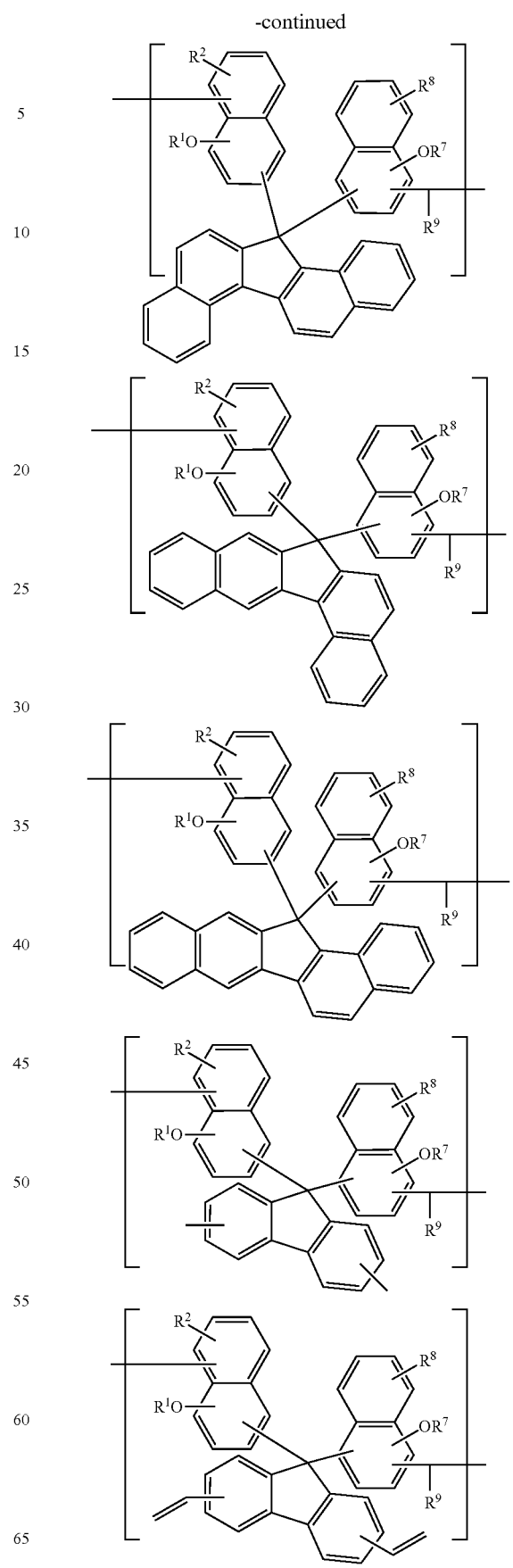

-continued
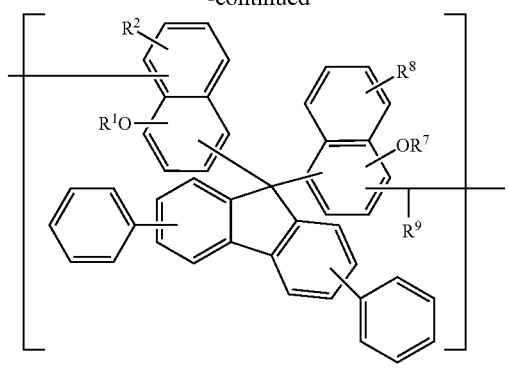
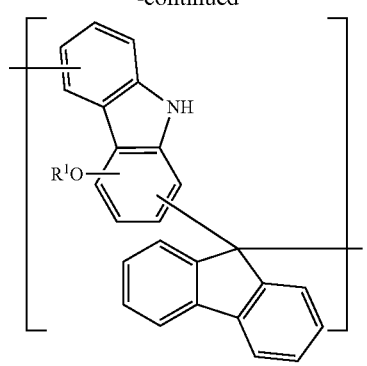
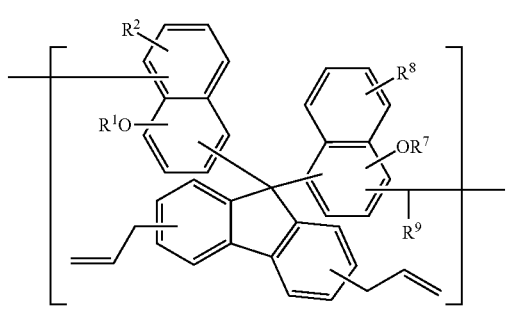
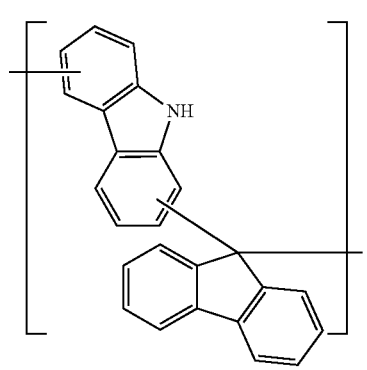
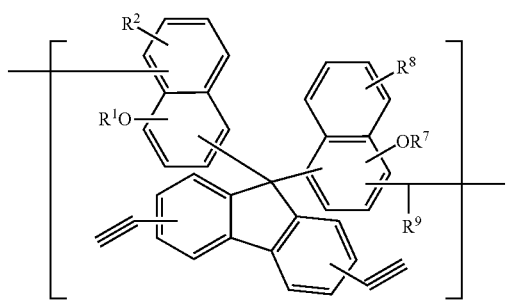
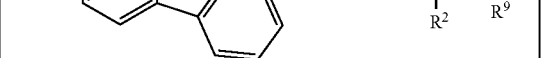
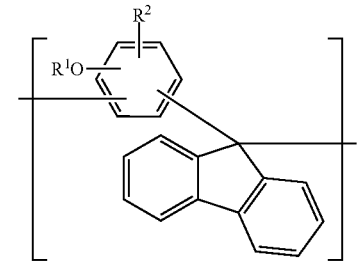
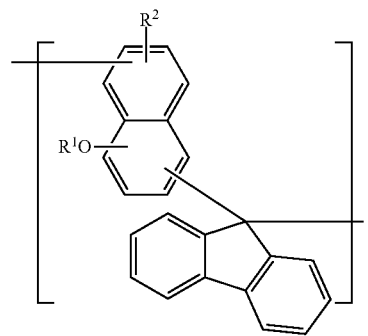
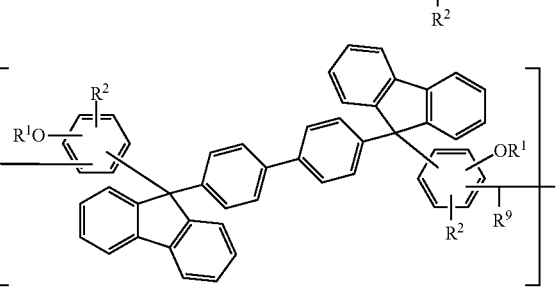

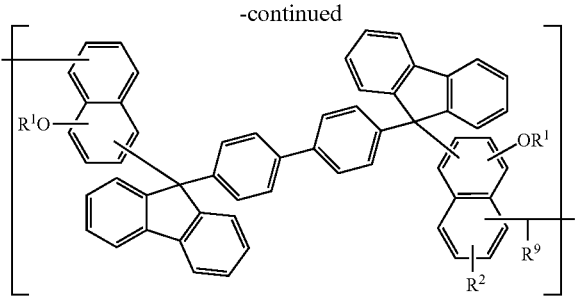
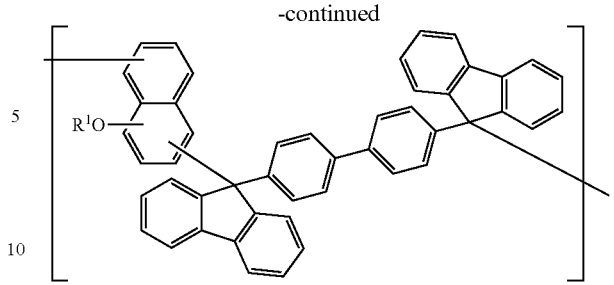
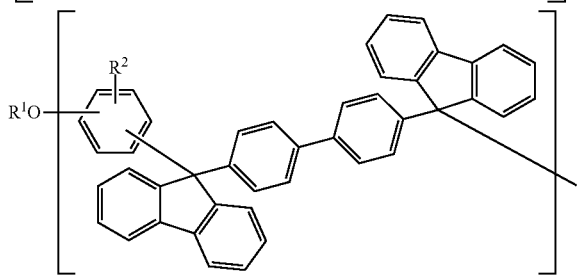

wherein $R^1$ and $R^2$ have the same meanings as defined above; $R^7$ is the same as $R^1$; $R^8$ is the same as $R^2$; and $R^9$ represents a hydrogen atom, an alkyl group having 1 to 10 carbon atoms, an alkenyl group having 2 to 10 carbon atoms, or an aryl group having 6 to 10 carbon atoms, and these groups optionally contain one or more groups selected from a hydroxy group, a carboxy group, an ester group, an ether group, and a lactone ring.

The compound shown by the general formula (3) in which a fluorene structure is contained may be exemplified by the following.

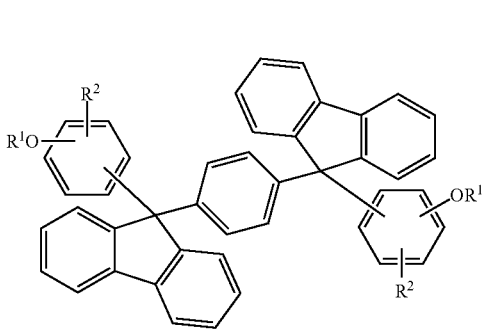
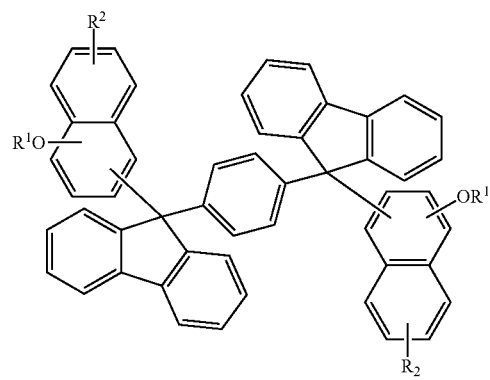
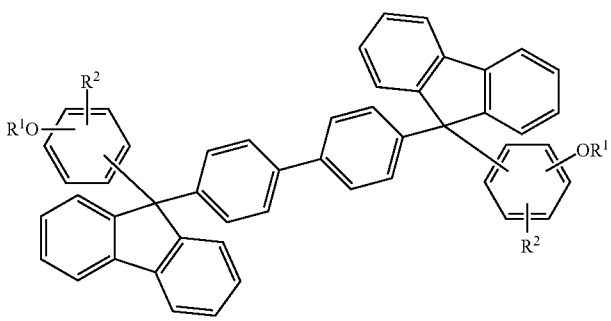
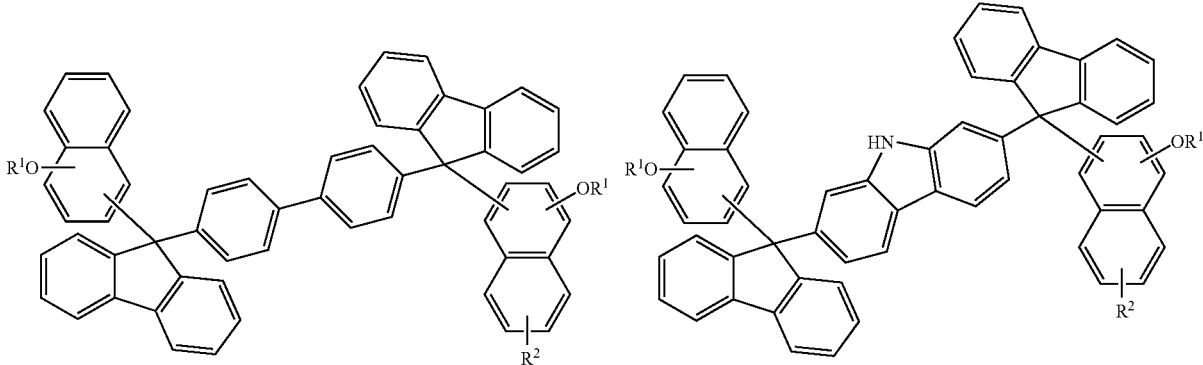

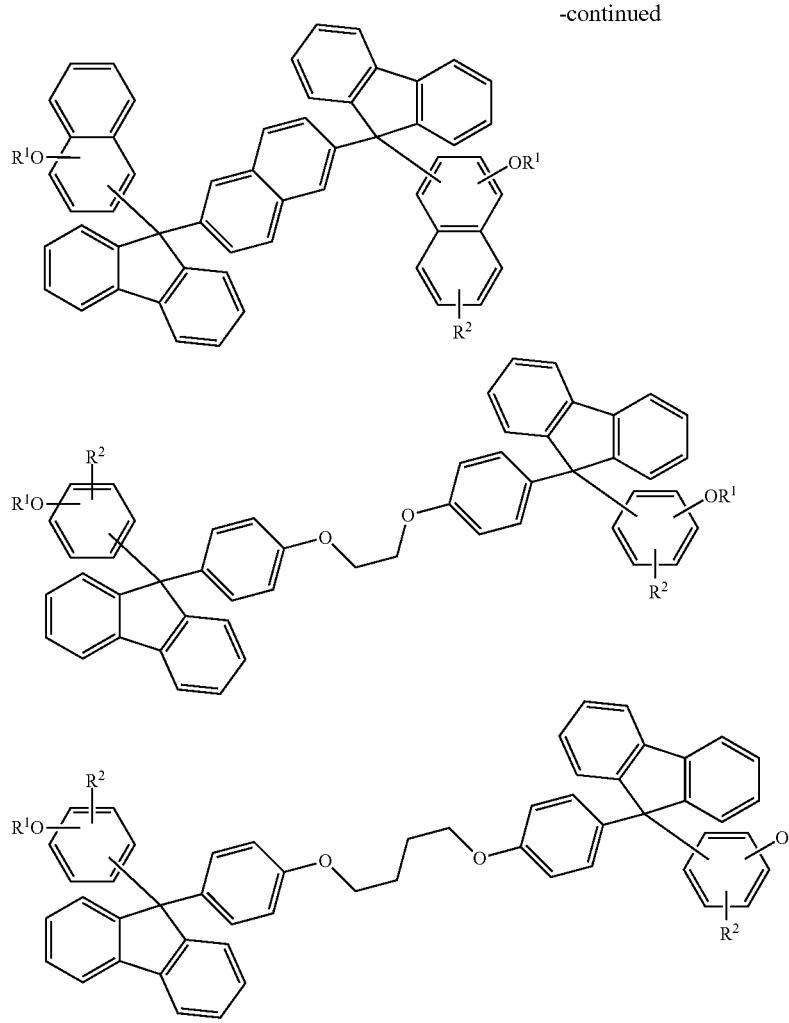

wherein R¹ and R² have the same meanings as defined above.

To the under layer film material, a compound (monomer) that has the following fluorene structure and so on can be added in addition to one or more species selected from the group consisting of the resins having a repeating unit shown by the general formula (1) in which a fluorene structure is contained, the resins having a repeating unit shown by the general formula (2) in which a fluorene structure is contained, and the compounds shown by the general formula (3) in which a fluorene structure is contained.

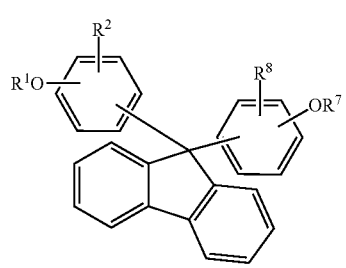

-continued

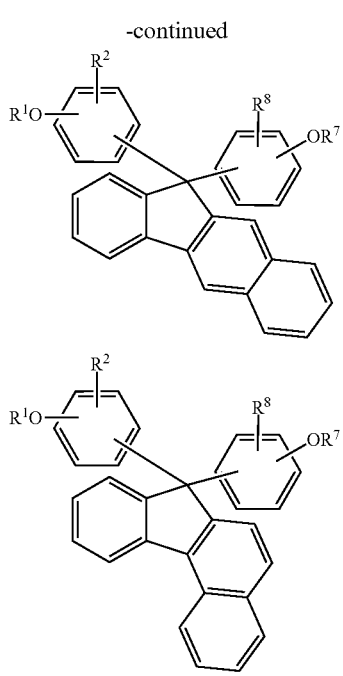

-continued
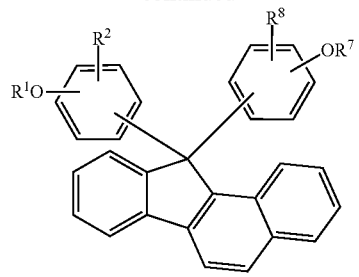
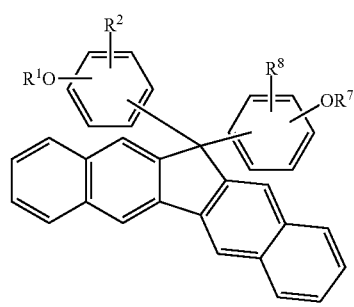
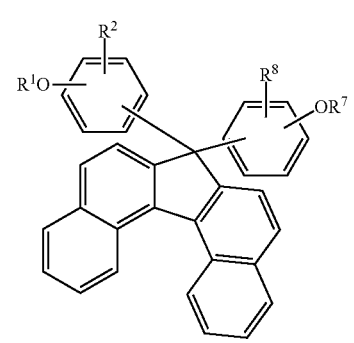
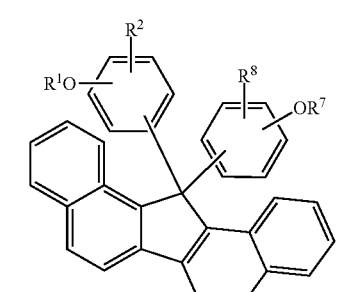
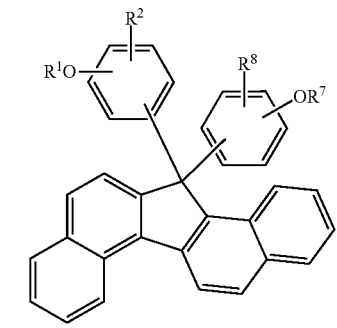
-continued
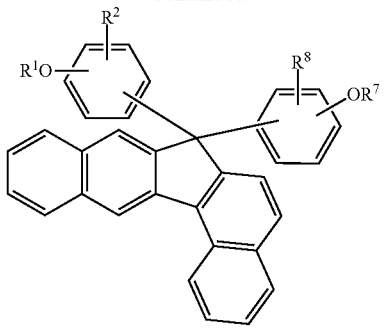
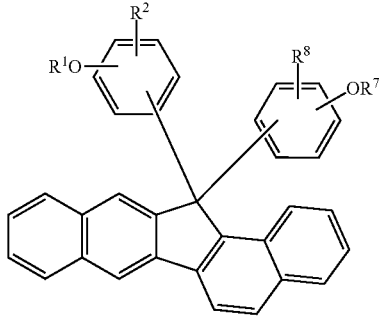
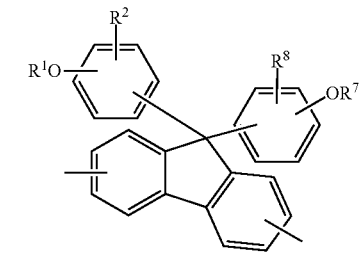
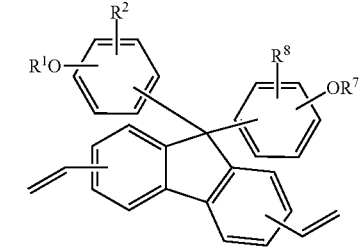
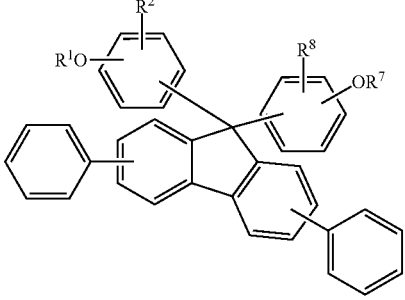
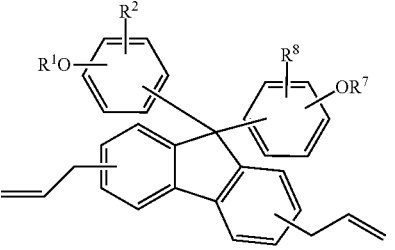

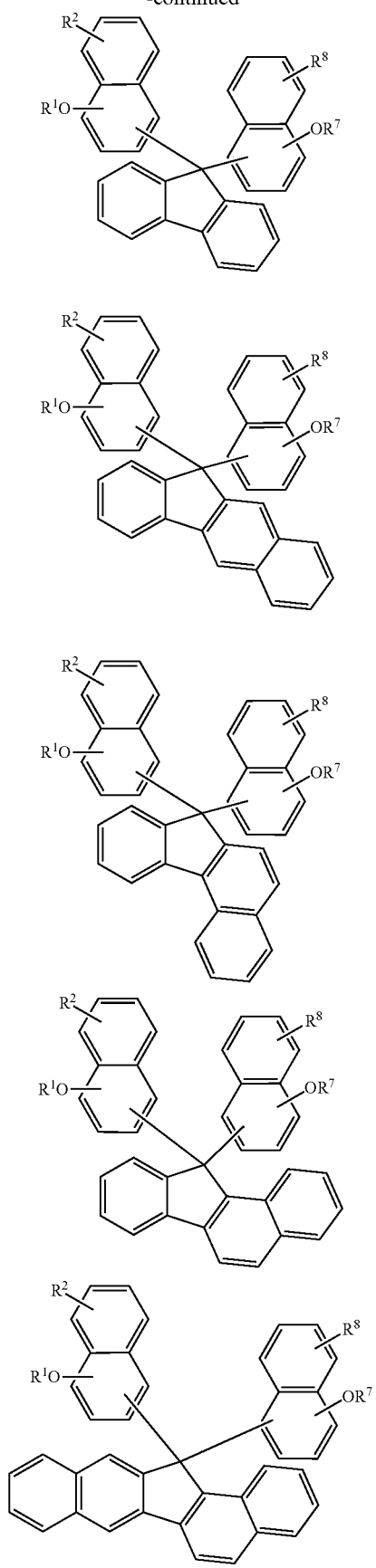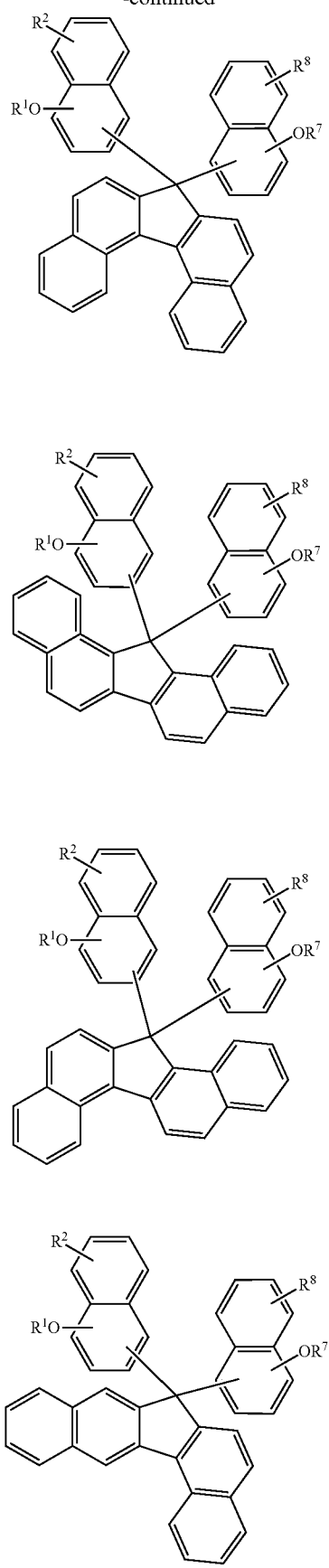

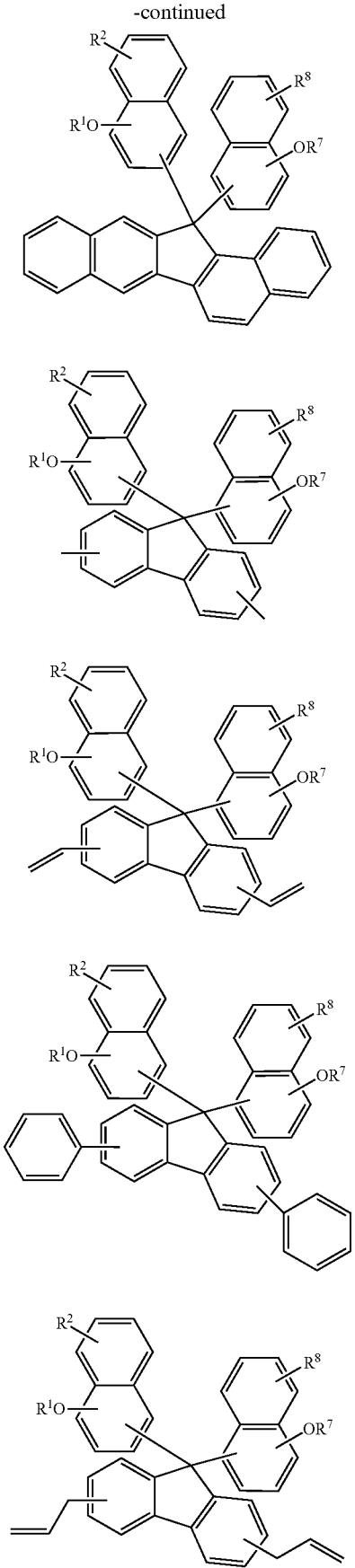
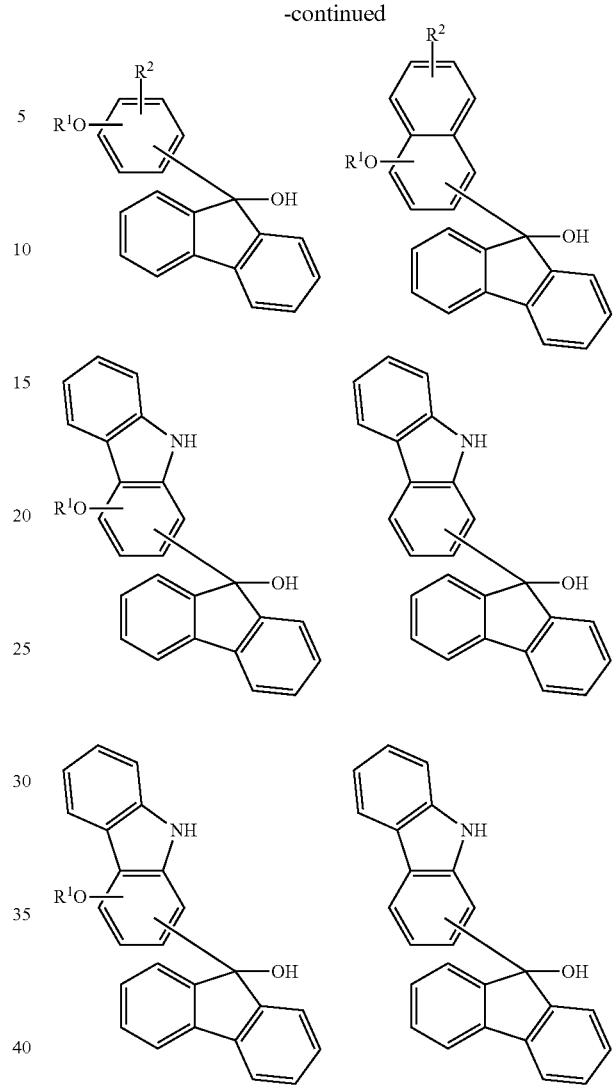

wherein $R^1$, $R^2$, $R^7$, and $R^8$ have the same meanings as defined above.

As mentioned above, a resin that has a repeating unit containing a novolac structure obtained by reacting a compound having a fluorene structure such as a fluorene bisphenol compound and a fluorene bisnaphthol compound in the presence of aldehydes (polycondensation) can be suitably used for the under layer film material to be used in the method for forming a multi-layer film of the present invention.

Examples of the aldehydes used in this reaction include formaldehyde, trioxane, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, 1-naphthaldehyde, 2-naphthaldehyde, and furfural.

Among these, formaldehyde is particularly suitably used. In addition, these aldehydes may be used alone or in combination of two or more kinds. The amount of the aldehydes to be used is preferably 0.2 to 5 mol, more preferably 0.5 to 2 mol per 1 mol of the compound having a fluorene structure.

A catalyst may be used in the condensation reaction of the compound having a fluorene structure with aldehyde. Illustrative examples of the catalyst include acidic catalysts such as hydrochloric acid, nitric acid, sulfuric acid, formic acid, oxalic acid, acetic acid, methanesulfonic acid, camphor sulfonic acid, tosic acid, and trifluoromethanesulfonic acid.

The amount of the acidic catalyst to be used is $1 \times 10^{-5}$ to $5 \times 10^{-1}$ mol per 1 mol of the compound having a fluorene structure. The aldehydes are not essential in the case of the copolymerization reaction with styrene, hydroxystyrene, vinylnaphthalene, hydroxyvinylnaphthalene, carbazole, vinylcarbazole, vinylanthrathene, indene, hydroxyindene, benzofuran, hydroxyanthrathene, acenaphthylene, biphenyl, bisphenol, trisphenol, or a compound having a non-conjugated double bond(s) such as dicyclopentadiene, tetrahydroindene, 4-vinylcyclohexene, norbornadiene, 5-vinylnorborna-2-ene, α-pinene, β-pinene, limonene, etc.

Preferable examples of a reaction solvent used in the polycondensation include water, methanol, ethanol, propanol, butanol, tetrahydrofuran, dioxane, and a mixed solvent thereof. These solvents are preferably used in the range of 0 to 2,000 parts by mass based on 100 parts by mass of the starting materials for the reaction.

The reaction temperature may be appropriately selected depending on the reactivities of starting materials for the reaction, and generally in the range of 10 to 200° C.

As the method of polycondensation, there may be mentioned a method in which the compound having a fluorene structure, the aldehydes, and the catalyst are charged at once; and a method in which the compound having a fluorene structure and the aldehydes are added dropwise in the presence of the catalyst. After completion of the polycondensation reaction, volatile components can be removed by raising the temperature inside the reaction vessel to 130 to 230° C. and reducing the pressure to about 1 to 50 mmHg for the purpose of removing unreacted starting materials, the catalyst, and so forth, existing in the reaction system.

The compound (monomer) having a fluorene structure for obtaining the resin having a repeating unit shown by the general formula (1) or (2) in which a fluorene structure is contained may be polymerized alone, or may be copolymerized with other phenols. Illustrative examples of the copolymerizable phenols include phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, and isothymol.

Illustrative examples of the other copolymerizable monomer include 1-naphthol, 2-naphthol, 2-methyl-1-naphthol, 4-methoxy-1-naphthol, 7-methoxy-2-naphthol, dihydroxynaphthalenes such as 1,5-dihydroxynaphthalene, 1,7-dihydroxynaphthalene, and 2,6-dihydroxynaphthalene, methyl 3-hydroxy-naphthalene-2-carboxylate, 4-tritylphenol, indene, hydroxyindene, benzofuran, hydroxyanthrathene, dihydroxyanthrathene, trihydroxyanthrathene, hydroxypyrene, acenaphthylene, biphenyl, bisphenol, trisphenol, xylene, dicyclopentadiene, tetrahydroindene, 4-vinylcyclohexene, norbornadiene, 5-vinylnorborna-2-ene, α-pinene, β-pinene, and limonene. The resin may be a copolymer of ternary or more adding these components.

It is also possible to co-condense with aromatic compounds substituted by a hydroxymethyl group, an alkoxymethyl group, a halomethyl group, or other group, by reacting aromatic compounds with aldehydes. Illustrative examples of the aromatic compounds substituted by an alcohol such as a hydroxymethyl group include benzene-dimethanol, benzenetrimethanol, toluenedimethanol, ethylbenzenedimethanol, propylbenzenedimethanol, butylbenzenedimethanol, cyclohexylbenzenedimethanol, xylenedimethanol, mesitylenedimethanol, naphthalene-dimethanol, naphthalenetrimethanol, methylnaphthalene-dimethanol, ethylnaphthalenedimethanol, propylnaphthalene-dimethanol, butylnaphthalenedimethanol, dimethylnaphthalenedimethanol, anthracenedimethanol, phenanthrenedimethanol, pyrenedimethanol, pentacene-dimethanol, fluorenedimethanol, biphenyldimethanol, bisnaphthalenedimethanol, fluoranthenedimethanol, indenedimethanol, acenaphthylenedimethanol, acephenanthrylenedimethanol, and aceanthrylenedimethanol. The aromatic compounds substituted by an alkoxymethyl group are compounds in which the hydroxymethyl group of the above-mentioned compounds is substituted by an alkoxymethyl group, and the aromatic compounds substituted by a halomethyl group are compounds in which the hydroxymethyl group of the above-mentioned compounds is substituted by a halomethyl group. In this case, the aldehyde is not necessarily required in the co-condensation reaction.

The molecular weight of the resin having a repeating unit shown by the general formula (1) or (2) containing a fluorene structure is preferably a weight average molecular weight (Mw) of 1,000 to 30,000, particularly preferably 2,000 to 20,000 in terms of polystyrene. The molecular weight distribution thereof is preferably in the range of 1.2 to 7, and those in which a monomer component, an oligomer component, or a low molecular weight component having a molecular weight (Mw) of 1,000 or less has cut to narrow the molecular weight distribution are preferred since crosslinking efficiency becomes high, and volatile components during baking is suppressed whereby contamination in the vicinity of the baking cup can be prevented.

It is possible to blend other polymer into the resin having a repeating unit shown by the general formula (1) in which a fluorene structure is contained, the resin having a repeating unit shown by the general formula (2) in which a fluorene structure is contained, and the compound shown by the general formula (3) in which a fluorene structure is contained. The polymer for blend preferably serves to improve film-formability in spin coating or embedding characteristics of the stepped substrate by mixing the polymer and/or the compound containing fluorene structure. More specifically, a polymer capable of reducing the softening point, such as polyethylene glycol, polypropyrene glycol, polyacrylate, polymethacrylate, polyacetal, and polyvinyl ether, is suitable.

In addition, a material having high carbon density and having high etching resistance may be blended. As examples of the material, there may be mentioned the same materials as exemplified for the hydrocarbon film material as described later.

The formulation amount of the polymer for blend may be 0 to 1,000 parts by mass, preferably 0 to 500 parts by mass based on total 100 parts by mass of the resin having a repeating unit shown by the general formula (1) in which a fluorene structure is contained, the resin having a repeating unit shown by the general formula (2) in which a fluorene structure is contained, and the compound shown by the general formula (3) in which a fluorene structure is contained.

Also, to the under layer film material to be used in the method for forming a multi-layer film of the present invention, a monomer component to be used for condensation of the resin containing a fluorene structure shown by the general formula (1) or (2) may be added. Addition of the monomer component has a merit of improving embedding characteristics without changing optical constant. The adding amount thereof is preferably 0 to 1,000 parts by mass, more preferably 0 to 500 parts by mass based on total 100 parts by mass of the resin having a repeating unit shown by the general formula (1) in which a fluorene structure is contained, the resin having a repeating unit shown by the general formula (2) in which a fluorene structure is contained, and the compound shown by the general formula (3) in which a fluorene structure is contained. The adding amount can be appropriately adjusted while observing the embedding characteristics. If the adding amount of the monomer component is too much, it becomes outgas during baking to generate particles, so that a baking furnace is contaminated in some cases. Thus, when the monomer component is added, it is preferred to keep the adding amount minimum which can ensure the embedding characteristics.

Conventionally, it has been required in the resist under layer film served as an antireflection film that there is no intermixing with the resist intermediate layer film containing silicon and the resist upper layer film formed on the resist under layer film, and that there is no diffusion of the low molecule component to the resist upper layer film and the resist intermediate layer film (Proc. SPIE Vol. 2195, p 225-229 (1994)). To prevent these problems, there has generally been employed a method in which the material is thermally crosslinked by baking after spin coating of the antireflection film.

Therefore, in the present invention, when a crosslinking agent is added as a component of the under layer film material, a crosslinkable substituent may be introduced into the polymer (resin) or the compound used as the material. Even when the crosslinking agent is not added, it is possible to cure the under layer film material containing one or more species selected from the resins having a repeating unit shown by the general formula (1) in which a fluorene structure is contained, the resins having a repeating unit shown by the general formula (2) in which a fluorene structure is contained, and the compounds shown by the general formula (3) in which a fluorene structure is contained by heating at 300° C. or higher. Particularly, in the case of a novolac resin having a fluorene structure, the resin can be crosslinked by heating at 300° C. or higher according to the reaction mechanism mentioned later. Incidentally, in the material for forming a multi-layer film such as a silicon oxide film material and a hydrocarbon film material, which will be described later, a crosslinkable substituent may be introduced into the polymer (resin) or the compound used as the material when a crosslinking agent is added.

Additives

A crosslinking agent may be added to the under layer film material to be used in the method for forming a multi-layer film of the present invention. The crosslinking agent may be specifically exemplified by the materials disclosed in paragraphs (0055) to (0060) of Japanese Patent Laid-Open Publication No. 2007-199653.

Also, to the under layer film material to be used in the method for forming a multi-layer film of the present invention, an acid generator for further promoting the crosslinking reaction by heat can be added. As the acid generator, there is a material which generates an acid by heat decomposition or a material which generates an acid by photoirradiation, and either of which may be added. The acid generator may be specifically exemplified by the materials disclosed in paragraphs (0061) to (0085) of Japanese Patent Laid-Open Publication No. 2007-199653.

Further, to the under layer film material to be used in the method for forming a multi-layer film of the present invention, a basic compound for improving preservation stability may be added. The basic compound acts as a quencher to an acid for preventing the crosslinking reaction from promoting by an acid generated from the acid generator with a minor amount. Such a basic compound may be specifically exemplified by the materials disclosed in paragraphs (0086) to (0090) of Japanese Patent Laid-Open Publication No. 2007-199653.

Moreover, to the under layer film material to be used in the method for forming a multi-layer film of the present invention, a solvent such as an organic solvent and water is preferably added. The usable organic solvent is not particularly limited so long as it can dissolve the resin or the compound, the acid generator, the crosslinking agent, and other additives to be used in the material. There may be specifically mentioned the solvents disclosed in paragraphs (0091) to (0092) of Japanese Patent Laid-Open Publication No. 2007-199653.

Furthermore, to the under layer film material to be used in the method for forming a multi-layer film of the present invention, a surfactant may be added for improving applicability by spin coating. The surfactant may be specifically exemplified by the materials disclosed in paragraphs (0165) to (0166) of Japanese Patent Laid-Open Publication No. 2008-111103.

These additives can also be added to a silicon oxide film material, a hydrocarbon film material, etc., which will be described later.

The under layer film material to be used in the method for forming a multi-layer film of the present invention is applied onto a substrate to be processed by the spin coating method, etc., similarly to a photoresist film material mentioned later. By using the spin coating method, good embedding characteristics can be obtained.

Further, after spin coating, baking is carried out to evaporate the solvent to promote the crosslinking reaction. The baking is carried out at a temperature of 300° C. or higher and 800° C. or lower, preferably 350° C. or higher and 700° C. or lower, much more preferably 400° C. or higher and 600° C. or lower for 10 to 4,000 seconds, preferably 10 to 3,000 seconds. Since the temperature is in a range of 300° C. to 800° C. when the titanium nitride film or the titanium oxynitride film is formed on the under layer film, the under layer film have to be baked previously at the foregoing temperature so as not to generate outgas from the under layer film in forming the titanium nitride film or the titanium oxynitride film. By baking the under layer film at ultrahigh temperature, etching resistance thereof can be enhanced when the substrate to be processed thereunder is subjected to dry etching.

The novolac resin generates phenoxy radicals by heating, and methylene groups of the novolac bonds are activated to crosslink the methylene groups to each other. Since this reaction is a radical reaction, no releasing molecule generates, so that no film shrinkage by crosslinking occurs if a material having high heat resistance is used. If oxygen is contained during baking, crosslinking due to oxidative coupling also proceeds. For promoting crosslinking by the oxidative coupling, baking in the atmosphere may be performed.

Baking may be carried out on a hot plate, or may be carried out in a furnace. When the furnace is used, a large amount of wafers can be treated at once, so that high throughput can be obtained. Baking may be carried out in the atmosphere, or in an inert gas such as nitrogen, helium, and argon gas. When baking is carried out in the inert gas, shrinkage amount of the film can be reduced. In addition, when baking is carried out in the inert gas, oxidation can be prevented, so that the increase in absorption and the decrease in etching resistance can also be prevented. Baking in the inert gas is preferably carried out at baking after crosslinking. Also, for preventing oxidation, oxygen concentration is preferably controlled. The oxygen concentration in the inert gas is preferably 1,000 ppm or less, more preferably 100 ppm or less.

The baking can be divided into multiple times. For example, it is possible to perform the first baking at a temperature of 100 to 300° C. on a hot plate, and to perform the second baking at 300 to 800° C. in a furnace. In this method, evaporation of the solvent and the crosslinking are carried out in the first baking, and pre-baking for forming a titanium nitride film is carried out in the second baking.

Also, up to now, a fluorocarbon series gas has been used in dry etching of the substrate to be processed, and this sometimes causes a phenomenon of bending of a line of the under layer film after dry etching. This bending of the line is considered to be caused by the reason that the under layer film is fluorinated during dry etching whereby the volume thereof is increased. To the contrary, when an under layer film which had been subjected to high temperature baking is used as in the present invention, the under layer film becomes dense and rigid, so that there is a merit that bending of the line of the under layer film after dry etching difficulty occurs.

Incidentally, the thickness of the under layer film is appropriately selected, and is preferably set to 30 to 20,000 nm, more preferably 50 to 15,000 nm, further preferably 80 to 10,000 nm.

Step (ii)

In the step (ii) of the method for forming a multi-layer film of the present invention, a titanium nitride film or a titanium oxynitride film is formed onto the under layer film formed as described above.

Titanium Nitride Film or Titanium Oxynitride Film

It is preferable that the formation of the titanium nitride film or the titanium oxynitride film be carried out by a sputtering method or a CVD method. The titanium nitride film can be formed by the same method as the sputtering method described in Japanese Patent Laid-Open Publication No. H11-026401 and Japanese Patent Laid-Open Publication No. 2015-151575, or the CVD method described in Japanese Patent Laid-Open Publication No. H08-246152. The titanium oxynitride film can be formed by the same method as the sputtering method described in Japanese Patent Laid-Open Publication No. H11-172414.

In order to form a high density film, the substrate have to be heated to 300° C. or higher in forming the titanium nitride film or the titanium oxynitride film. In order to suppress generation of outgas from the under layer film in forming the titanium nitride film or the titanium oxynitride film, the substrate with the under layer film being previously formed thereon have to be baked at the temperature for forming the titanium nitride film or the titanium oxynitride film or higher (i.e., 300° C. or higher). Accordingly, the under layer film formed in the step (i) needs heat resistance to endure such a temperature.

The film thickness of the titanium nitride film or the titanium oxynitride film is preferably 3 to 100 nm, more preferably 5 to 50 nm. The titanium nitride film and the titanium oxynitride film have excellent dry etching resistance, and therefore they do not need to be formed thick.

Onto the titanium nitride film or the titanium oxynitride film, a hydrocarbon film for usual tri-layer process is formed (step (iii)), a silicon oxide film is formed thereon (step (iv)), and a photoresist film is further formed thereon (step (A) of the patterning process mentioned later). Exposure light is reflected on the titanium nitride film or the titanium oxynitride film, and does not reach to the under layer film under the same. Reflection can be suppressed by controlling a phase and an absorption of the two layers of the hydrocarbon film and the silicon oxide film on the titanium nitride film or the titanium oxynitride film as antireflection films. If the n value of the refractive index of the hydrocarbon film is close to the n value of the photoresist film, reflection of the substrate can be made 1% or less even when the film thickness of the silicon oxide film is 20 nm or less. As described above, one of the objects of the present invention is to accomplish both of reducing reflectance of the substrate and thinning the silicon oxide film. Accordingly, it is important to select a material having a high n value for the hydrocarbon film under the silicon oxide film to make the silicon oxide film just below the photoresist film a thin film having a film thickness of 20 nm or less.

Step (iii)

In the step (iii) of the method for forming a multi-layer film of the present invention, a hydrocarbon film material is applied onto the titanium nitride film or the titanium oxynitride film formed as mentioned above to form a hydrocarbon film.

Hydrocarbon Film

As the hydrocarbon film material to be used in the method for forming a multi-layer film of the present invention, a material having high carbon density and high etching resistance is selected. Illustrative examples of such a material include a novolac resin prepared by phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, 4,4'-(9H-fluoren-9- ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenyl-4,4'-(9H-fluoren-9-ylidene)bisphenol, 2,2'-dimethoxy-4,4'-(9H-fluoren-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, 7-methoxy-2-naphthol, dihydroxynaphthalene such as 1,5-dihydroxynaphthalene, 1,7-dihydroxynaphthalene, and 2,6-dihydroxynaphthalene, methyl 3-hydroxy-naphthalene-2-carboxylate, indene, hydroxyindene, benzofuran, hydroxyanthrathene, acenaphthylene, biphenyl, bisphenol, trisphenol, dicyclopentadiene, tetrahydroindene, 4-vinylcyclohexene, norbornadiene, 5-vinylnorborna-2-ene, α-pinene, β-pinene, limonene, etc.; polyhydroxystyrene, polystyrene, polyvinylnaphthalene, polyvinylanthrathene, polyvinylcarbazole, polyindene, polyacenaphthylene, polynorbornene, polycyclodecene, polytetracyclododecene, polynortricyclene, poly(meth)acrylate, and a copolymer thereof.

In addition, it may be blended with a resin compound such as a nortricyclene copolymer disclosed in Japanese Patent Laid-Open Publication No. 2004-205658, a hydrogenated naphthol novolac resin disclosed in Japanese Patent Laid-Open Publication No. 2004-205676, a naphthol dicyclopentadiene copolymer disclosed in Japanese Patent Laid-Open Publication No. 2004-205685, a phenol dicyclopentadiene copolymer disclosed in Japanese Patent Laid-Open Publication No. 2004-354554 and No. 2005-010431, a fluorene bisphenol novolac resin disclosed in Japanese Patent Laid-Open Publication No. 2005-128509, an acenaphthylene copolymer disclosed in Japanese Patent Laid-Open Publication No. 2005-250434, an indene copolymer disclosed in Japanese Patent Laid-Open Publication No. 2006-053543, a fullerene having a phenol group disclosed in Japanese Patent Laid-Open Publication No. 2006-227391, a bisphenol compound and a novolac resin thereof disclosed in Japanese Patent Laid-Open Publication No. 2006-259249, No. 2006-293298 and No. 2007-316282, a dibisphenol compound and a novolac resin thereof disclosed in Japanese Patent Laid-Open Publication No. 2006-259482, a novolac resin of an adamantanephenol compound disclosed in Japanese Patent Laid-Open Publication No. 2006-285095, a hydroxyvinylnaphthalene copolymer disclosed in Japanese Patent Laid-Open Publication No. 2007-171895, a bisnaphthol compound and a novolac resin thereof disclosed in Japanese Patent Laid-Open Publication No. 2007-199653, ROMP (Ring-Opening Metathesis Polymer) disclosed in Japanese Patent Laid-Open Publication No. 2008-026600, and a tricyclopentadiene copolymerized material disclosed in Japanese Patent Laid-Open Publication No. 2008-096684.

Among these materials, a material having a high n value is a material in which the content of an aromatic group is low and the ratio of an alicyclic group is high. For example, a resin containing dicyclopentadiene, tricyclopentadiene, acenaphthylene, adamantane, ROMP and/or a nortricyclene series material is more suitable than a novolac series material. These materials have a high n value, so that even when the film thickness of the silicon oxide film thereon is thinned to 20 nm or less, reflectance of the substrate can be suppressed to 1% or less.

In the method for forming a multi-layer film of the present invention, the hydrocarbon film is preferably formed by the spin coating method. The film thickness of the hydrocarbon film is preferably in the range of 5 to 100 nm, more preferably 10 to 80 nm.

Step (iv)

In the step (iv) of the method for forming a multi-layer film of the present invention, a silicon oxide film material is applied onto the hydrocarbon film formed as mentioned above to form a silicon oxide film.

Silicon Oxide Film

As the silicon oxide film material to be used in the method for forming a multi-layer film of the present invention, there may be mentioned a silsesquioxane type material having an absorption at the exposure wavelength as disclosed in Japanese Patent Laid-Open Publication No. 2007-302873.

As the silsesquioxane type material, a silicon resin such as the one synthesized by hydrolysis condensation of a tri-functional, tetra-functional in certain case, alkoxysilane is particularly preferable.

In the method for forming a multi-layer film of the present invention, the silicon oxide film is preferably formed by the spin coating method. The film thickness of the silicon oxide film is preferably 10 to 20 nm.

A multi-layer film laminated in the order of the under layer film, the titanium nitride film or the titanium oxynitride film, the hydrocarbon film, and the silicon oxide film onto the substrate can be formed by the method including the steps (i) to (iv) as explained above. When such a method for forming a multi-layer film is employed, a multi-layer film that can be suitably used as the resist under layer film in the lithography, has an optimum n value and k value and embedding characteristics as the anti-reflection film, and further has excellent etching resistance can be formed. In addition, when the films other than the titanium nitride film or the titanium oxynitride film are formed by the spin coating method, the cost can be reduced compared with a method for forming these films by sputtering method or a CVD method.

Patterning Process

The present invention provides a patterning process using the multi-layer film formed as mentioned above, which includes the steps of:
(A) forming a photoresist film on the multi-layer film which has been formed on the substrate by the above-mentioned method for forming a multi-layer film;
(B) forming a photoresist pattern by subjecting the photoresist film to exposure and development;
(C) transferring the pattern to the silicon oxide film by dry etching using the photoresist pattern as a mask;
(D) transferring the pattern to the hydrocarbon film by dry etching using the silicon oxide film to which the pattern has been transferred as a mask;
(E) transferring the pattern to the titanium nitride film or the titanium oxynitride film by dry etching using the hydrocarbon film to which the pattern has been transferred as a mask;
(F) transferring the pattern to the under layer film by dry etching using the titanium nitride film or the titanium oxynitride film to which the pattern has been transferred as a mask; and (G) transferring the pattern to the substrate by dry etching using the titanium nitride film or the titanium oxynitride film and the under layer film to which the pattern has been transferred as a mask.

Hereinafter, an example of the patterning process (penta-layer (5-layer) process) of the present invention is explained by referring to FIG. 2, but the patterning process of the present invention is not limited thereto.

Figure 2:
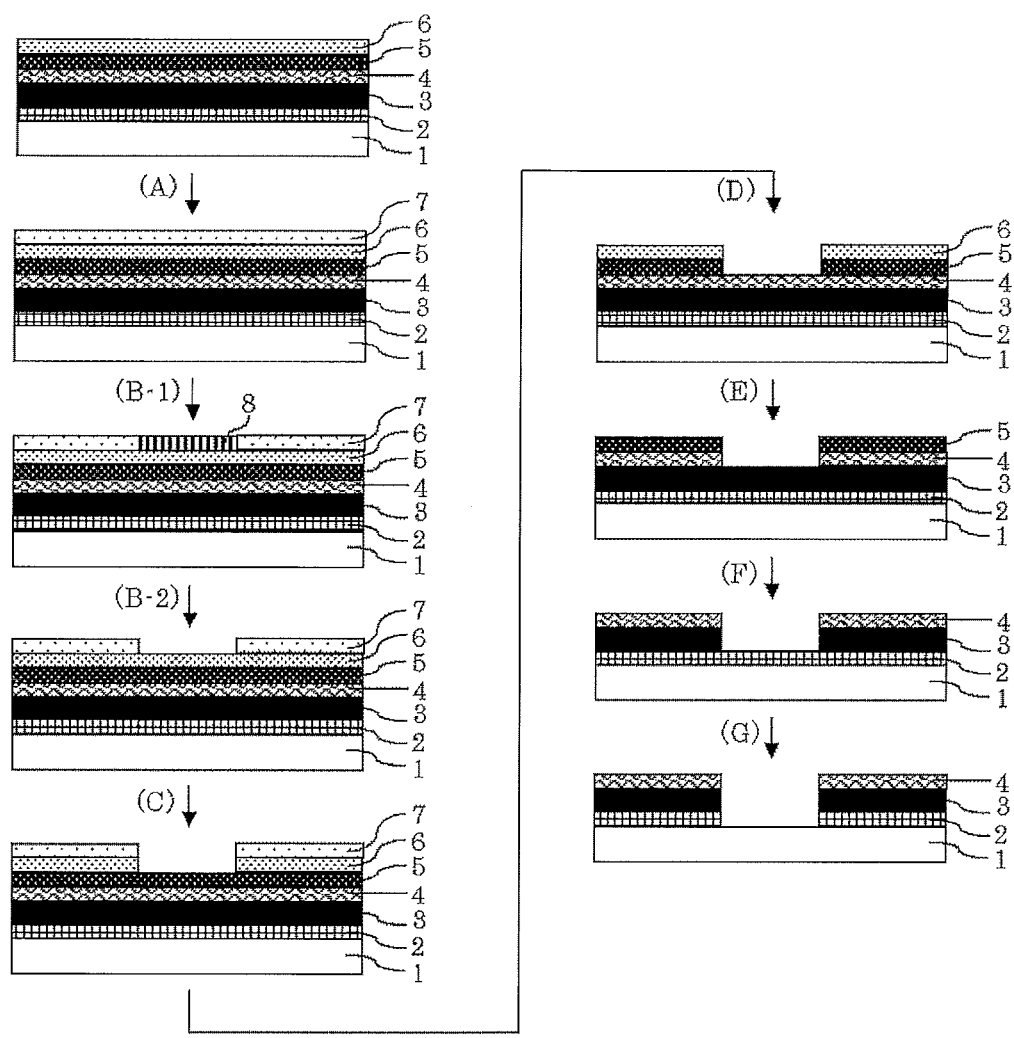
FIG. 2 is a flow chart showing an example of the patterning process of the present invention.

In the patterning process of FIG. 2, as the step (A), a photoresist film 7 is firstly formed onto a multi-layer film (a silicon oxide film 6 at the uppermost layer) formed on a substrate by the method for forming a multi-layer film mentioned above (FIG. 2(A)).

As a material for forming the photoresist film 7, it is possible to use either a positive type or a negative type, and to use the same material as the commonly used photoresist composition. Also, when a single layer photoresist film is to be formed by the photoresist composition, the spin coating method is preferably used similarly to the case where the under layer film or the like is formed. After spin coating of the photoresist composition, pre-baking is preferably carried out under the conditions of at 60 to 180° C. for 10 to 300 seconds. The thickness of the photoresist film is not particularly limited, and preferably in the range of 30 to 500 nm, particularly preferably 50 to 400 nm.

Next, as the step (B), prescribed portions (exposed portions 8) of the photoresist film 7 are exposed (FIG. 2 (B-1)), and after subjecting to post exposure baking (PEB), development is carried out to form a photoresist pattern (FIG. 2 (B-2)). In the case of the positive pattern, as shown in FIG. 2, the exposed portions 8 are dissolved in the developer, whereas in the case of the negative pattern, unexposed portions are dissolved in the developer.

As the exposure light, there may be mentioned a high energy beam having a wavelength of 300 nm or less, more specifically, far ultraviolet rays, KrF excimer laser light (248 nm), ArF excimer laser light (193 nm), $F_2$ laser light (157 nm), $Kr_2$ laser light (146 nm), $Ar_2$ laser light (126 nm), soft X-ray having a wavelength of 3 to 20 nm (e.g., EUV (wavelength 13.5 nm)), electron beam (EB), X-ray, etc.

Next, as the step (C), dry etching is carried out using the photoresist pattern as a mask to transfer the pattern to the silicon oxide film 6 (FIG. 2(C)). As the etching gas to be used in the step (C), a fluorocarbon series gas is suitable.

Next, as the step (D), dry etching is carried out using the silicon oxide film 6 to which the pattern has been transferred as a mask to transfer the pattern to the hydrocarbon film 5 (FIG. 2(D)). As the etching gas to be used in the step (D), one or more gases selected from an oxygen gas, a hydrogen gas, an ammonia gas, a carbon dioxide gas, a carbon monoxide gas, and a sulfur dioxide gas are suitable. Also, the dry etching of the step (D) may be an oxygen plasma etching.

Next, as the step (E), dry etching is carried out using the hydrocarbon film 5 to which the pattern has been transferred as a mask to transfer the pattern to the titanium nitride film 4 (or the titanium oxynitride film) (FIG. 2(E)). As the etching gas to be used in the step (E), a gas containing bromine or chlorine is suitable.

Next, as the step (F), dry etching is carried out using the titanium nitride film 4 (or the titanium oxynitride film) to which the pattern has been transferred as a mask to transfer the pattern to the under layer film 3 (FIG. 2(F)). As the etching gas to be used in the step (F), one or more gases selected from an oxygen gas, a hydrogen gas, an ammonia gas, a carbon dioxide gas, a carbon monoxide gas, and a sulfur dioxide gas are suitable.

Further, as the step (G), dry etching may be carried out using the titanium nitride film 4 (or the titanium oxynitride film) to which the pattern has been transferred and the under layer film 3 to which the pattern has been transferred as masks to transfer the pattern to the layer to be processed 2 of the substrate 1 (FIG. 2(G)). As the etching gas to be used in the step (G), when the layer to be processed 2 is $SiO_2$, SiN, or a silica series low dielectric constant insulating film, an etching gas mainly composed of a fluorocarbon series gas is suitable, and when the layer to be processed 2 is p-Si, Al, or W, an etching gas mainly composed of a chlorine series or bromine series gas is suitable. Incidentally, in the present invention, the titanium nitride film 4 (or the titanium oxynitride film) and the under layer film 3 are films both having resistance to the etching gas for the layer to be processed 2.

According to the patterning process of the present invention as explained above, a pattern is formed by a 5-layer (penta-layer) process using a photoresist film and a multi-layer film having optimum n value and k value, embedding characteristics as an antireflection film, and excellent etching resistance, so that, in particular, even when a negative tone resist pattern developed by an organic solvent which is thin and vulnerable in dry etching resistance is used, the pattern can be transferred with high accuracy.

EXAMPLES

In the following, the present invention is explained more specifically by referring to Examples and Comparative Examples, but the present invention is not limited to these. Incidentally, as the molecular weight and the dispersity of the polymer, a weight average molecular weight (Mw), a number average molecular weight (Mn), and a dispersity (Mw/Mn) were determined by gel permeation chromatography (GPC) in terms of polystyrene.

Under layer film polymers 1 to 8 and Under layer film monomers 1 to 4 used in under layer film materials are shown below.

Under layer film polymer 1: Mw=3,500, Mw/Mn=4.50

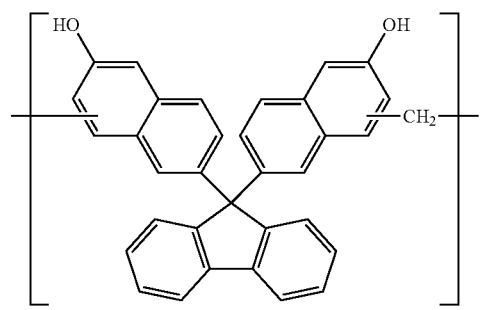

Under layer film polymer 1

Under layer film polymer 2: Mw=3,100, Mw/Mn=4.80

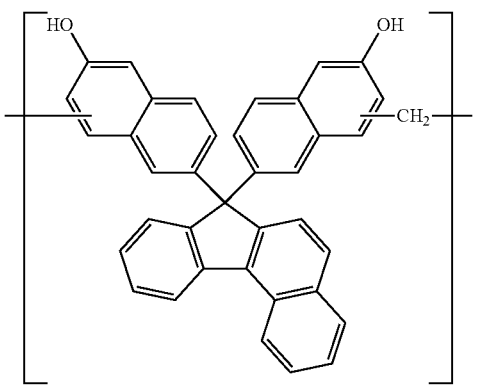

Under layer film polymer 2

Under layer film polymer 3: Mw=2,600, Mw/Mn=5.10

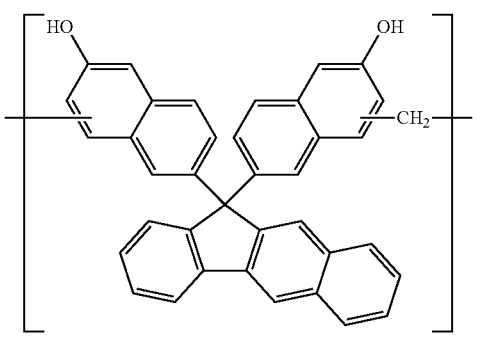

Under layer film polymer 3

Under layer film polymer 4: Mw=3,600, Mw/Mn=4.80

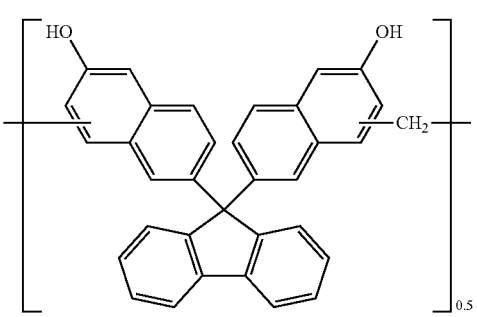

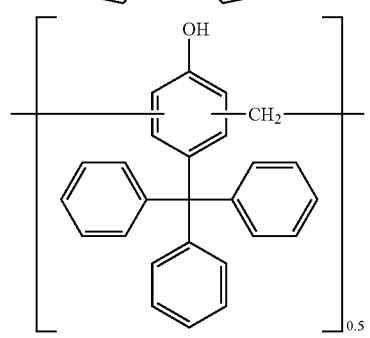

Under layer film polymer 4

Under layer film polymer 5: Mw=3,200, Mw/Mn=5.40

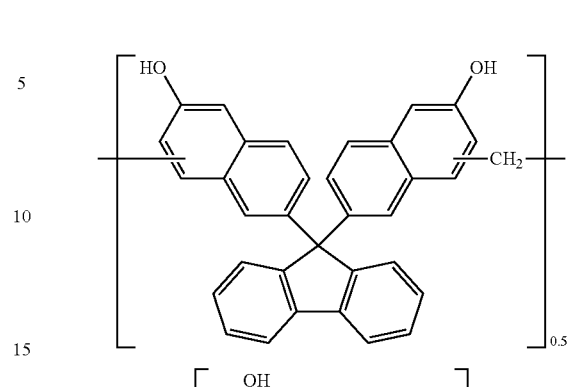

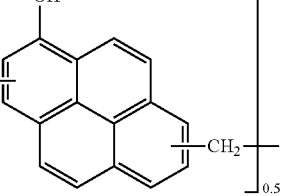

Under layer film polymer 5

Under layer film polymer 6: Mw=6,200, Mw/Mn=6.40

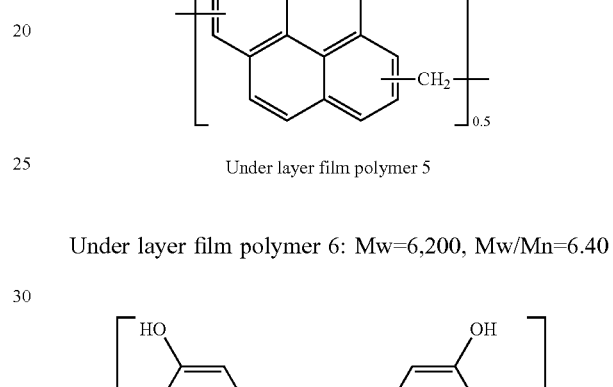

Under layer film polymer 6

Under layer film polymer 7: Mw=6,500, Mw/Mn=5.20

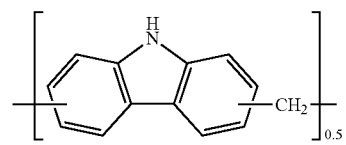

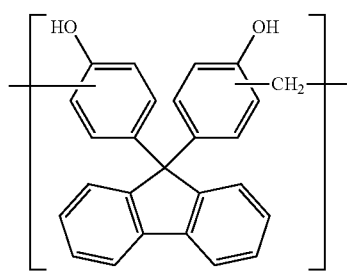

Under layer film polymer 7

Under layer film polymer 8: Mw=3,200, Mw/Mn=5.40

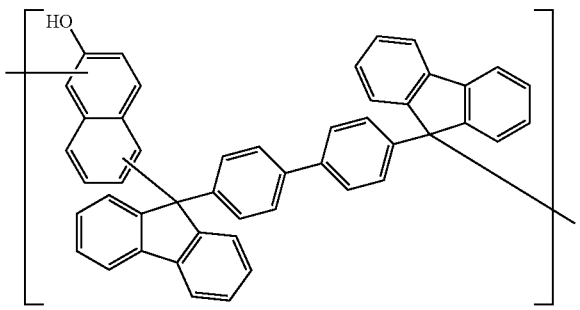

Under layer film polymer 8

Under layer film monomer 1

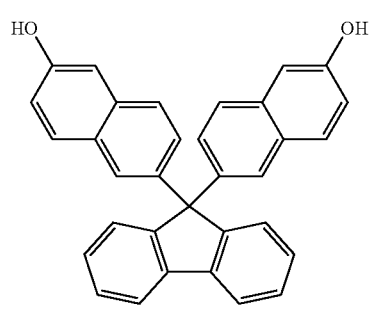

Under layer film monomer 1

Under layer film monomer 2

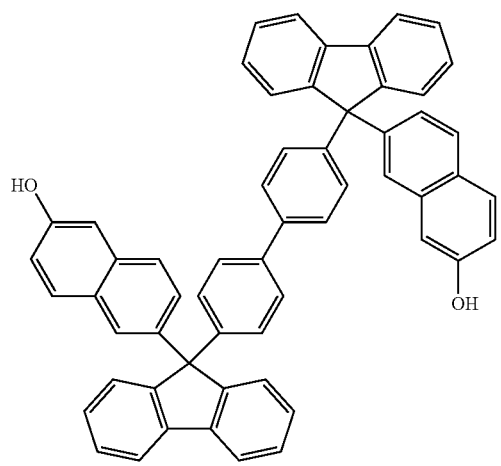

Under layer film monomer 2

Under layer film monomer 3

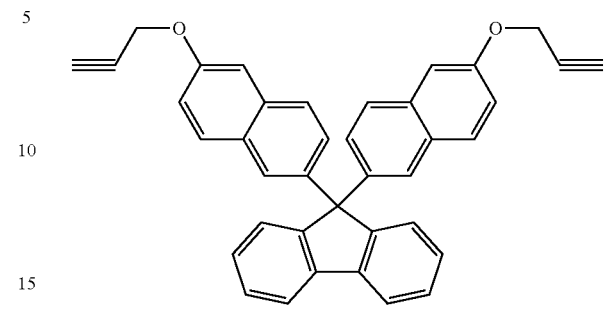

Under layer film monomer 3

Under layer film monomer 4

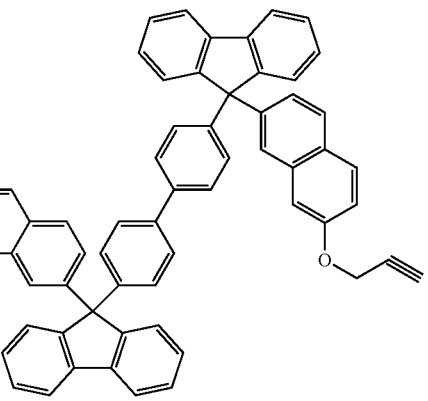

Under layer film monomer 4

Hydrocarbon film polymers 1 to 4 used in hydrocarbon film materials are shown below. In Comparative UDL-1, Hydrocarbon film polymer 1 and Hydrocarbon film polymer 3 were used for the under layer film material.

Hydrocarbon film polymer 1 (Comparative under layer film polymer 1): Mw=6,900, Mw/Mn=1.88

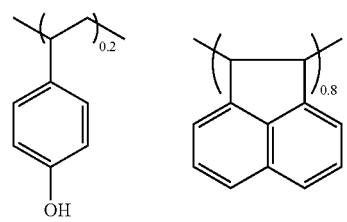

Hydrocarbon film polymer 1
(Comparative under layer film polymer 1)

Hydrocarbon film polymer 2: Mw=7,200, Mw/Mn=1.79

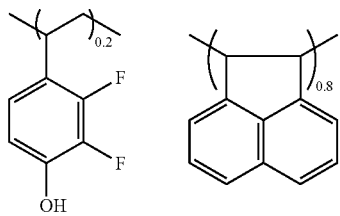

Hydrocarbon film polymer 2

Hydrocarbon film polymer 3 (Comparative under layer film polymer 2): Mw=890, Mw/Mn=3.53

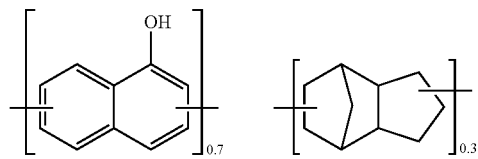

Hydrocarbon film polymer 3
(Comparative under layer film polymer 2)

Hydrocarbon film polymer 4: Mw=9,900, Mw/Mn=1.23

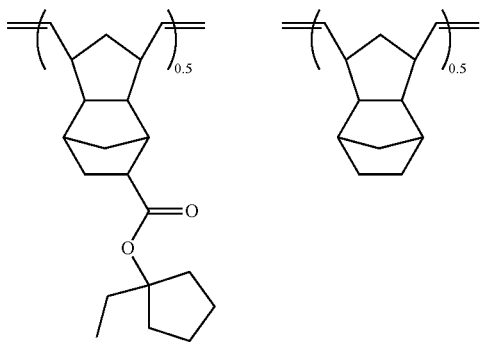

Hydrocarbon film polymer 4

Silicon oxide film polymer 1 used in a silicon oxide film material is shown below.

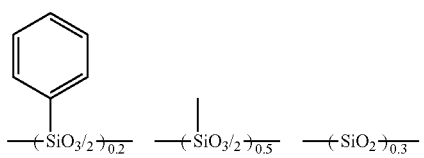

Silicon oxide film polymer 1

Acid generators AG1 and AG2, and Crosslinking agent CR1 used in the under layer film materials, the hydrocarbon film materials, and the silicon oxide film material are shown below.

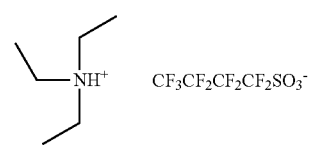

AG1

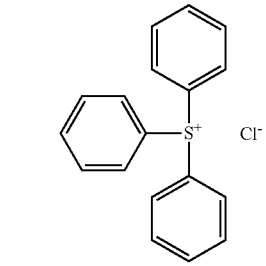

AG2

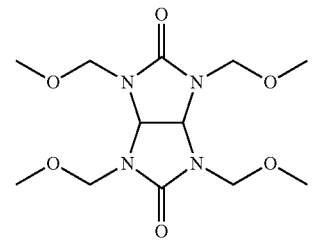

CR1

ArF resist polymer 1, Acid generator PAG1, Quencher, and Water-repellent polymer 1 used in a photoresist film material are shown below.

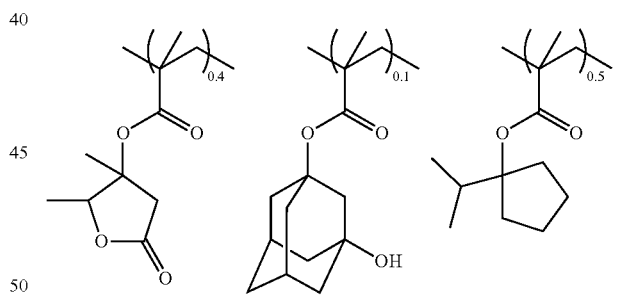

ArF resist polymer 1

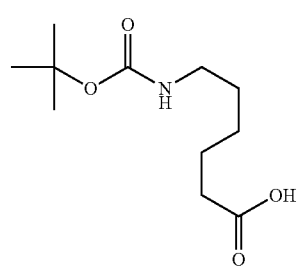

Quencher

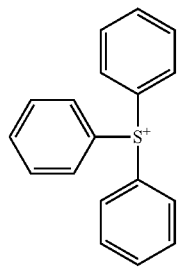
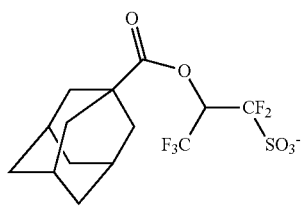

PAG1

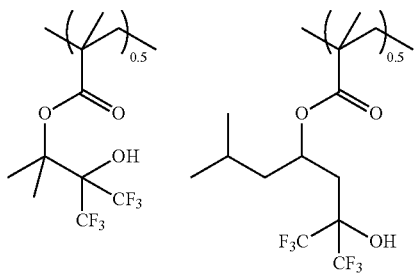

Water-repellent polymer 1

The solvents used in the under layer film materials, the hydrocarbon film materials, the silicon oxide film material, and the photoresist film material are shown below.

PGMEA: Propylene glycol monomethyl ether acetate
Cyclohexanone
Water
PGEE: Propylene glycol monoethyl ether
GBL: γ-butyrolactone Preparation of Film Materials Preparation of Under Layer Film Materials (UDL-1 to 11 and Comparative UDL-1)

The resins shown by Under layer film polymers 1 to 8 and Comparative under layer film polymers 1 and 2 (Hydrocarbon film polymers 1 and 3), Under layer film monomers 1 to 4, Acid generator AG1, and Crosslinking agent CR1 were dissolved in a solvent containing 0.1% by mass of FC-4430 (available from Sumitomo 3M Ltd.) with the ratio shown in Table 1, and the solutions were filtered through a filter made of a fluorine resin having a pore size of 0.1 μm to prepare under layer film materials (UDL-1 to 11 and Comparative UDL-1).

TABLE 1

| Under layer film material | Polymer/Monomer (parts by mass) | Crosslinking agent (parts by mass) | Acid generator (parts by mass) | Surfactant (% by mass) | Solvent (parts by mass) |
|---|---|---|---|---|---|
| UDL-1 | Under layer film polymer 1 (10) | — | — | FC-4430 (0.1) | PGMEA (200) |
| UDL-2 | Under layer film polymer 2 (10) | — | — | FC-4430 (0.1) | PGMEA (100) Cyclohexanone (100) |
| UDL-3 | Under layer film polymer 3 (10) | — | — | FC-4430 (0.1) | PGMEA (100) Cyclohexanone (100) |
| UDL-4 | Under layer film polymer 4 (10) | — | — | FC-4430 (0.1) | PGMEA (100) Cyclohexanone (100) |
| UDL-5 | Under layer film polymer 5 (10) | — | — | FC-4430 (0.1) | PGMEA (100) Cyclohexanone (100) |
| UDL-6 | Under layer film polymer 6 (10) | — | — | FC-4430 (0.1) | PGMEA (100) Cyclohexanone (100) |
| UDL-7 | Under layer film polymer 7 (1) Under layer film polymer 8 (1) Under layer film monomer 2 (9) | — | — | FC-4430 (0.1) | PGMEA (100) Cyclohexanone (100) |
| UDL-8 | Under layer film polymer 1 (5) Under layer film monomer 1 (5) | — | — | FC-4430 (0.1) | PGMEA (200) |
| UDL-9 | Under layer film polymer 1 (3) Under layer film monomer 3 (7) | — | — | FC-4430 (0.1) | PGMEA (200) |
| UDL-10 | Under layer film monomer 2 (12) | — | — | FC-4430 (0.1) | PGMEA (200) |
| UDL-11 | Under layer film monomer 4 (12) | — | — | FC-4430 (0.1) | PGMEA (200) |

TABLE 1-continued

| Under layer film material | Polymer/Monomer (parts by mass) | Crosslinking agent (parts by mass) | Acid generator (parts by mass) | Surfactant (% by mass) | Solvent (parts by mass) |
|---|---|---|---|---|---|
| Comparative UDL-1 | Comparative under layer film polymer 1 (5) Comparative under layer film polymer 2 (5) | CR1 (1) | AG1 (0.2) | FC-4430 (0.1) | PGMEA (200) |

Preparation of Hydrocarbon Film Materials (HCL-1 to 3)

The resins shown by Hydrocarbon film polymers 1 to 4, Acid generator AG1, and Crosslinking agent CR1 were dissolved in a solvent containing 0.1% by mass of FC-4430 (available from Sumitomo 3M Ltd.) with the ratio shown in Table 2, and the solutions were filtered through a filter made of a fluorine resin having a pore size of 0.1 μm to prepare hydrocarbon film materials (HCL-1 to 3).

TABLE 2

| Hydrocarbon film material | Polymer (parts by mass) | Crosslinking agent (parts by mass) | Acid generator (parts by mass) | Surfactant (% by mass) | Solvent (parts by mass) |
|---|---|---|---|---|---|
| HCL-1 | Hydrocarbon film polymer 1 (5) Hydrocarbon film polymer 3 (5) | CR1 (1) | AG1 (0.2) | FC-4430 (0.1) | PGMEA (400) |
| HCL-2 | Hydrocarbon film polymer 2 (5) Hydrocarbon film polymer 3 (5) | CR1 (1) | AG1 (0.2) | FC-4430 (0.1) | PGMEA (400) |
| HCL-3 | Hydrocarbon film polymer 1 (5) Hydrocarbon film polymer 4 (5) | — | — | FC-4430 (0.1) | PGMEA (200) Cyclohexanone (200) |

Preparation of Silicon Oxide Film Material (SOG-1)

The resin shown by Silicon oxide film polymer 1 and Acid generator AG2 were dissolved in a solvent containing 0.1% by mass of FC-4430 (available from Sumitomo 3M Ltd.) with the ratio shown in Table 3, and the solution was filtered through a filter made of a fluorine resin having a pore size of 0.1 μm to prepare a silicon oxide film material (SOG-1).

TABLE 3

| Silicon oxide film material | Polymer (parts by mass) | Crosslinking agent (parts by mass) | Acid generator (part by mass) | Surfactant (% by mass) | Solvent (parts by mass) |
|---|---|---|---|---|---|
| SOG-1 | Silicon oxide film polymer 1 (5) | — | AG2 (0.2) | FC-4430 (0.1) | PGEE (1000) Water (100) |

Preparation of Photoresist Film Material (ArF Resist 1)

The resin shown by ArF resist polymer 1, Acid generator PAG1, Quencher, and Water-repellent polymer 1 were dissolved in a solvent containing 0.1% by mass of FC-4430 (available from Sumitomo 3M Ltd.) with the ratio shown in Table 4, and the solution was filtered through a filter made of a fluorine resin having a pore size of 0.1 μm to prepare a photoresist film material (ArF resist 1).

TABLE 4

| Photoresist film material | Polymer (parts by mass) | Acid generator (parts by mass) | Quencher (parts by mass) | Water-repellent agent (parts by mass) | Surfactant (% by mass) | Solvent (parts by mass) |
|---|---|---|---|---|---|---|
| ArF resist 1 | ArF resist polymer 1 (100) | PAG1 (15.0) | Quencher (2.5) | Water-repellent polymer 1 (5.0) | FC-4430 (0.1) | PGMEA (3000) GBL (15) |

Measurements of Refractive Index of Under Layer Film and Film Thickness Before and after High Temperature Baking The under layer film materials (UDL-1 to 11 and Comparative UDL-1) were each applied onto a silicon substrate (wafer), and baked at 200° C. for 60 seconds to form under layer films each having a film thickness of 100 nm, and refractive index (n value and k value) at a wavelength of 193 nm and film thickness "a" after baking at 200° C. of each under layer film were measured by using an incident angle variable spectroscopic ellipsometer (VASE; manufactured by J.A. Woollam Co., Inc.). Then, as to UDL-1 to 8 and Comparative UDL-1, the wafer was baked on a hot plate at 350° C. for 1 minute, film thickness "b" after baking at 350° C. was measured, and the ratio of the film thicknesses before and after baking at 350° C. was calculated. As to UDL-9 to 11, the wafer was put into a furnace filled with nitrogen to adjust oxygen concentration to 10 ppm or less, and baked at 450° C. for 30 minutes, film thickness "b" after baking at 450° C. was measured, and the ratio of the film thicknesses before and after baking at 450° C. was calculated. The results are shown in Table 5.

TABLE 5

| Under layer film material | Film thickness "a" after baking at 200° C. (nm) | Refractive index n value | Refractive index k value | Film thickness "b" after baking at 350° C. (or 450° C.) (nm) | Ratio of film thicknesses before and after baking at 350° C. (or 450° C.) b/a × 100 (%) |
|---|---|---|---|---|---|
| UDL-1 | 105 | 1.33 | 0.44 | 102 | 98 |
| UDL-2 | 106 | 1.32 | 0.46 | 105 | 99 |
| UDL-3 | 92 | 1.31 | 0.47 | 91 | 99 |
| UDL-4 | 101 | 1.33 | 0.46 | 98 | 97 |
| UDL-5 | 106 | 1.38 | 0.50 | 104 | 98 |
| UDL-6 | 107 | 1.37 | 0.48 | 104 | 97 |
| UDL-7 | 102 | 1.38 | 0.50 | 100 | 98 |
| UDL-8 | 101 | 1.37 | 0.48 | 97 | 96 |
| UDL-9 | 107 | 1.37 | 0.48 | 104 | 97 |
| UDL-10 | 102 | 1.39 | 0.48 | 100 | 98 |
| UDL-11 | 101 | 1.40 | 0.44 | 97 | 96 |
| Comparative UDL-1 | 99 | 1.35 | 0.64 | 36 | 36 |

<Measurement of Refractive Index of Hydrocarbon Film and Silicon Oxide Film>

The hydrocarbon film materials (HCL-1 to 3), and the silicon oxide film material (SOG-1) were each applied onto a silicon substrate. Each of these were baked at 200° C. for 60 seconds to form a hydrocarbon film with a film thickness of 40 nm and a silicon oxide film with a film thickness of 20 nm. Then, refractive index (n value and k value) of each film at a wavelength of 193 nm was measured by using an incident angle variable spectroscopic ellipsometer (VASE; manufactured by J.A. Woollam Co., Inc.). The results are shown in Table 6.

TABLE 6

| Film material | Refractive index n value | Refractive index k value |
|---|---|---|
| HCL-1 (Hydrocarbon film) | 1.50 | 0.30 |
| HCL-2 (Hydrocarbon film) | 1.55 | 0.28 |
| HCL-3 (Hydrocarbon film) | 1.61 | 0.31 |
| SOG-1 (Silicon oxide film) | 1.60 | 0.20 |

Pattern Etching Test

Formation of Multi-Layer Film

Examples 1 to 13 and Comparative Example 1

Each of the under layer film materials (UDL-1 to 8 and Comparative UDL-1) shown in Table 1 was applied by spin coating onto a Si wafer substrate having a diameter of 300 mm on which a $SiO_2$ film (a layer to be processed) having a film thickness of 200 nm had been formed, and baked at 350° C. for 60 seconds to form an under layer film having a film thickness of 100 nm. Each of the under layer film materials (UDL-9 to 11) shown in Table 1 was applied by spin coating onto a Si wafer substrate having a diameter of 300 mm on which a $SiO_2$ film (a layer to be processed) having a film thickness of 200 nm had been formed, and baked at 350° C. for 60 seconds. Thereafter, the wafer was put into a furnace filled with nitrogen to adjust oxygen concentration to 10 ppm or less, and baked at 450° C. for 30 minutes to form an under layer film having a film thickness of 100 nm.

Then, onto the substrate having the under layer film thus formed, sputtering was performed by the following conditions to form a titanium nitride film with a thickness of 20 nm onto the under layer film.

Sputtering Conditions

| Target | Titanium |
|---|---|
| Sputter gas | Nitrogen |
| Chamber pressure | 0.5 Pa |
| RF power | 1,000 W |
| Time | 120 sec |
| Temperature of substrate | 450° C. |

Subsequently, the hydrocarbon film materials (HCL-1 to 3) shown in Table 2 were applied thereto by spin coating, and baked at 220° C. for 60 seconds to form a hydrocarbon film having a film thickness of 40 nm. Further, the silicon oxide film material (SOG-1) shown in Table 3 was applied thereto by spin coating, and baked at 200° C. for 60 seconds to form a silicon oxide film having a film thickness of 20 nm, thereby obtaining a multi-layer film (4 layers).

Comparative Example 2

The under layer film material (UDL-1) shown in Table 1 was applied by spin coating onto a Si wafer substrate having a diameter of 300 mm on which a $SiO_2$ film (a layer to be processed) having a film thickness of 200 nm had been formed, and baked at 350° C. for 60 seconds to form an under layer film having a film thickness of 100 nm. In Comparative Example 2, the silicon oxide film material (SOG-1) was applied onto the under layer film by spin coating without forming the titanium nitride film and the hydrocarbon film, and baked at 200° C. for 60 seconds to form a silicon oxide film having a film thickness of 20 nm, thereby obtaining a multi-layer film (2 layers).

Comparative Example 3

The under layer film material (UDL-1) shown in Table 1 was applied by spin coating onto a Si wafer substrate having a diameter of 300 mm on which a $SiO_2$ film (a layer to be processed) having a film thickness of 200 nm had been formed, and baked at 350° C. for 60 seconds to form an under layer film having a film thickness of 100 nm. Then, a titanium nitride film having a thickness of 20 nm was formed onto the under layer film in the same manner as in the foregoing Examples. In Comparative Example 3, the silicon oxide film material (SOG-1) was applied onto the titanium nitride film by spin coating without forming the hydrocarbon film, and baked at 200° C. for 60 seconds to form a silicon oxide film having a film thickness of 20 nm, thereby obtaining a multi-layer film (3 layers).

Formation of Pattern

The photoresist film material (ArF resist 1) shown in Table 4 was applied by spin coating onto each of the substrates of Examples 1 to 13 and Comparative Examples 1 to 3 on which the multi-layer film had been formed as mentioned above, and baked at 100° C. for 60 seconds to form a photoresist film having a film thickness of 70 nm. According to this procedure, Examples 1 to 13 and Comparative Example 1 formed a structure of a penta-layer (5 layers), Comparative Example 2 formed a structure of a tri-layer (3 layers), and Comparative Example 3 formed a structure of a tetra-layer (4 layers).

These samples were exposed by using an ArF excimer laser liquid immersion scanner (NSR-610C; manufactured by Nikon Corporation, NA-1.30, σ=0.98/0.78, dipole opening 20°, Azimuthally polarized illumination, 6% halftone phase shift mask) while changing the exposure dose, and after the exposure, baked (PEB) at 80° C. for 60 seconds, developed by 2.38% by mass of an aqueous tetramethylammonium hydroxide (TMAH) solution for 30 seconds, rinsed with pure water, and spin-dried to form a 40 nm line and space pattern.

Then, (a) dry etching was carried out by using the resist pattern thus formed as a mask to transfer the pattern to the silicon oxide film, (b) dry etching was carried out by using the obtained silicon oxide film pattern as a mask to transfer the pattern to the hydrocarbon film, (c) dry etching was carried out by using the obtained hydrocarbon film pattern as a mask to transfer the pattern to the titanium nitride film, (d) dry etching was carried out by using the obtained titanium nitride film pattern as a mask to transfer the pattern to the under layer film, and (e) dry etching was carried out by using the titanium nitride film pattern and the obtained under layer film pattern as masks to transfer the pattern to the $SiC_2$ film, whereby processing the layer to be processed.

Etching conditions are as shown below.

(a) Transfer (Etching) Conditions of Resist Pattern to Silicon Oxide Film

| | |
|---|---|
| Chamber pressure | 10.0 Pa |
| RF power | 1,500 W |
| $CF_4$ gas flow rate | 75 mL/min |
| $O_2$ gas flow rate | 15 mL/min |
| Time | 12 sec |

(b) Transfer (Etching) Conditions of Silicon Oxide Film Pattern to Hydrocarbon Film

| | |
|---|---|
| Chamber pressure | 2.0 Pa |
| RF power | 500 W |
| Ar gas flow rate | 75 mL/min |
| $O_2$ gas flow rate | 45 mL/min |
| Time | 30 sec |

(c) Transfer (Etching) Conditions of Hydrocarbon Film Pattern to Titanium Nitride Film

| | |
|---|---|
| Chamber pressure | 40.0 Pa |
| RF power | 300 W |
| $Cl_2$ gas flow rate | 30 mL/min |
| $BCl_3$ gas flow rate | 30 mL/min |
| $CHF_3$ gas flow rate | 100 mL/min |
| $O_2$ gas flow rate | 2 mL/min |
| Time | 30 sec |

(d) Transfer (Etching) Conditions of Titanium Nitride Film Pattern to Under Layer Film

| | |
|---|---|
| Chamber pressure | 2.0 Pa |
| RF power | 500 W |
| Ar gas flow rate | 75 mL/min |
| $O_2$ gas flow rate | 45 mL/min |
| Time | 100 sec |

(e) Transfer (Etching) Conditions of Titanium Nitride Film Pattern and Under Layer Film Pattern to $SiO_2$ Film

| | |
|---|---|
| Chamber pressure | 2.0 Pa |
| RF power | 2,200 W |
| $C_5F_{12}$ gas flow rate | 20 mL/min |
| $C_2F_6$ gas flow rate | 10 mL/min |
| Ar gas flow rate | 300 mL/min |
| $O_2$ gas flow rate | 60 mL/min |
| Time | 90 sec |

In Comparative Example 2, after transferring the resist pattern to the silicon oxide film under the condition (a), the silicon oxide film pattern was transferred to the under layer film under the condition (d), and the under layer film pattern was further transferred to the $SiO_2$ film under the condition (e), whereby processing the layer to be processed.

In Comparative Example 3, after transferring the resist pattern to the silicon oxide film under the condition (a), the silicon oxide film pattern was transferred to the titanium nitride film under the condition (c), the titanium nitride film pattern was transferred to the under layer film under the condition (d), and the under layer film pattern was further transferred to the $SiO_2$ film under the condition (e), whereby processing the layer to be processed.

Pattern cross sectional shapes of the substrates of Examples 1 to 13 and Comparative Examples 1 to 3 in which the layers to be processed had been processed as mentioned above were observed by using an electron microscope (S-4700; manufactured by Hitachi, Ltd.), and their shapes were compared. The results are shown in Table 7.

TABLE 7

| | Under layer film | Titanium nitride film | Hydrocarbon film | Silicon oxide film | Photoresist film | Pattern shape after transfer etching to substrate |
|---|---|---|---|---|---|---|
| Example 1 | UDL-1 | Existence | HCL-1 | SOG-1 | ArF resist 1 | Rectangular |
| Example 2 | UDL-2 | Existence | HCL-1 | SOG-1 | ArF resist 1 | Rectangular |
| Example 3 | UDL-3 | Existence | HCL-1 | SOG-1 | ArF resist 1 | Rectangular |
| Example 4 | UDL-4 | Existence | HCL-1 | SOG-1 | ArF resist 1 | Rectangular |
| Example 5 | UDL-5 | Existence | HCL-1 | SOG-1 | ArF resist 1 | Rectangular |
| Example 6 | UDL-6 | Existence | HCL-1 | SOG-1 | ArF resist 1 | Rectangular |
| Example 7 | UDL-7 | Existence | HCL-1 | SOG-1 | ArF resist 1 | Rectangular |
| Example 8 | UDL-8 | Existence | HCL-1 | SOG-1 | ArF resist 1 | Rectangular |
| Example 9 | UDL-9 | Existence | HCL-1 | SOG-1 | ArF resist 1 | Rectangular |
| Example 10 | UDL-10 | Existence | HCL-1 | SOG-1 | ArF resist 1 | Rectangular |
| Example 11 | UDL-11 | Existence | HCL-1 | SOG-1 | ArF resist 1 | Rectangular |
| Example 12 | UDL-1 | Existence | HCL-2 | SOG-1 | ArF resist 1 | Rectangular |
| Example 13 | UDL-1 | Existence | HCL-3 | SOG-1 | ArF resist 1 | Rectangular |
| Comparative Example 1 | Comparative UDL-1 | Existence | HCL-1 | SOG-1 | ArF resist 1 | Tapered shape |
| Comparative Example 2 | UDL-1 | None | None | SOG-1 | ArF resist 1 | Pattern collapse |
| Comparative Example 3 | UDL-1 | Existence | None | SOG-1 | ArF resist 1 | Tapered shape |

As shown in Table 7, in Examples 1 to 13, in which the pattern was formed by the penta-layer process using the multi-layer film formed by the method for forming a multi-layer film of the present invention as a resist under layer film, a pattern having a cross sectional shape of rectangular could be obtained. In Examples 1 to 13, as shown in Table 5, a titanium oxide film was formed on the under layer film that causes little reduction of the film thickness even after baking at a high temperature of 350° C. or 450° C., and the hydrocarbon film and the silicon oxide film having refractive indexes (antireflection effect) as shown in Table 6 were formed thereon. According to this constitution, light is totally reflected on the titanium nitride film, and substrate reflection can be reduced by two-layered antireflection film composed of the hydrocarbon film and the silicon oxide film formed thereon. In addition, since the substrate reflection can be suppressed even when the film thickness of the silicon oxide film just below the resist is thinned, the resist pattern can be smoothly transferred by dry etching to the silicon oxide film. Further, the shape of the pattern of the substrate to be processed as the base material after dry etching becomes good because of excellent dry etching resistance of the titanium nitride film.

On the other hand, in Comparative Example 1, in which Comparative UDL-1 was used as the under layer film material, a cross sectional shape of the pattern was tapered after dry etching of the substrate to be processed as shown in Table 7. Also, in Comparative Example 2, in which neither the titanium nitride film nor the hydrocarbon film had been formed (tri-layer process), pattern collapse occurred as shown in Table V. In Comparative Example 3, in which the hydrocarbon film had not been formed (tetra-layer process), since it had a large reflection from the base material and insufficient selectivity in dry etching of the titanium nitride film by using the silicon oxide film, the pattern became tapered shape finally after the dry etching of the substrate to be processed.

From the results as mentioned above, it has revealed that formation of the pattern by the penta-layer process using the multi-layer film formed by the inventive method for forming a multi-layer film achieves excellent antireflection effect than the conventional tri-layer process or tetra-layer process and excellent selectivity of dry etching, and can form a pattern with good shape thereby.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for forming a multi-layer film on a substrate, comprising the steps of:

(i) forming an under layer film on the substrate by applying an under layer film material containing one or more species selected from the group consisting of resins having a repeating unit shown by the following general formula (1) in which a fluorene structure is contained, resins having a repeating unit shown by the following general formula (2) in which a fluorene structure is contained, and compounds shown by the following general formula (3) in which a fluorene structure is contained, and curing the same by heat treatment at a temperature of 300° C. or higher and 800° C. or lower for 10 to 4,000 seconds;

(ii) forming a titanium nitride film or a titanium oxynitride film on the under layer film;

(iii) forming a hydrocarbon film on the titanium nitride film or the titanium oxynitride film by applying a hydrocarbon film material; and (iv) forming a silicon oxide film on the hydrocarbon film by applying a silicon oxide film material,

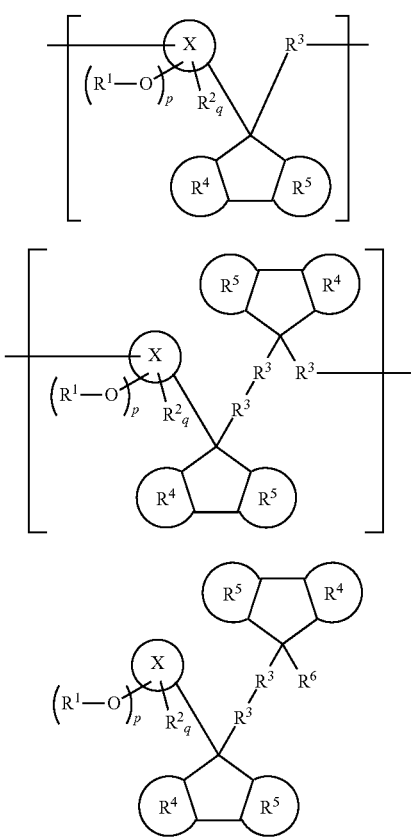

wherein X represents a benzene ring, a naphthalene ring, or a carbazole ring; $R^1$ represents a hydrogen atom, a glycidyl group, a linear, branched, or cyclic alkyl group having 1 to 10 carbon atoms, an aryl group having 6 to 20 carbon atoms, an alkenyl group having 2 to 20 carbon atoms, or an alkynyl group having 2 to 20 carbon atoms; $R^2$ represents a hydrogen atom, a linear, branched, or cyclic alkyl group having 1 to 10 carbon atoms, an aryl group having 6 to 10 carbon atoms, an alkenyl group having 2 to 6 carbon atoms, or an alkynyl group having 2 to 6 carbon atoms; each $R^3$ independently represents a single bond, a carbazole ring, an alkylene group having 1 to 20 carbon atoms, an alkenylene group having 2 to 20 carbon atoms, or an arylene group having 6 to 20 carbon atoms, and optionally contains one or more groups selected from an ether group, an ester group, a hydroxy group, a carboxy group, a glycidyloxy group, an alkyl group having 1 to 10 carbon atoms, an aryl group having 6 to 10 carbon atoms, an alkeny group having 2 to 6 carbon atoms, an alkyny group having 2 to 6 carbon atoms, an alkoxy group having 1 to 10 carbon atoms, an aryloxy group having 6 to 20 carbon atoms, an alkenyloxy group having 2 to 20 carbon atoms, and an alkynyloxy group having 2 to 20 carbon atoms; $R^4$ and $R^5$ independently represent a benzene ring or a naphthalene ring, and a hydrogen atom(s) in the benzene ring or the naphthalene ring is/are optionally substituted by a hydrocarbon group having 1 to 6 carbon atoms; $R^6$ represents a hydrogen atom, an alkyl group having 1 to 20 carbon atoms, an alkenyl group having 2 to 6 carbon atoms, an alkynyl group having 2 to 6 carbon atoms, or an aryl group having 6 to 10 carbon atoms, and when $R^6$ is an aryl group, a hydrogen atom(s) in the aryl group is/are optionally substituted by a hydroxy group, a carboxy group, a halogen atom, a glycidyloxy group, an alkyl group having 1 to 10 carbon atoms, an aryl group having 6 to 10 carbon atoms, an alkeny group having 2 to 6 carbon atoms, an alkyny group having 2 to 6 carbon atoms, an alkoxy group having 1 to 10 carbon atoms, an aryloxy group having 6 to 20 carbon atoms, an alkenyloxy group having 2 to 20 carbon atoms, or an alkynyloxy group having 2 to 20 carbon atoms; and "p" and "q" independently represent an integer of 0 to 2.

2. The method for forming a multi-layer film according to claim 1, wherein applying of the materials in the steps (i), (iii), and (iv) is carried out by a spin coating method.

3. The method for forming a multi-layer film according to claim 1, wherein forming of the titanium nitride film or the titanium oxynitride film in the step (ii) is carried out by a sputtering method or a CVD method.

4. The method for forming a multi-layer film according to claim 2, wherein forming of the titanium nitride film or the titanium oxynitride film in the step (ii) is carried out by a sputtering method or a CVD method.

5. The method for forming a multi-layer film according to claim 1, wherein the under layer film having a film thickness of 30 to 20,000 nm is formed in the step (i), the titanium nitride film or the titanium oxynitride film having a film thickness of 3 to 100 nm is formed in the step (ii), the hydrocarbon film having a film thickness of 5 to 100 nm is formed in the step (iii), and the silicon oxide film having a film thickness of 10 to 20 nm is formed in the step (iv).

6. The method for forming a multi-layer film according to claim 2, wherein the under layer film having a film thickness of 30 to 20,000 nm is formed in the step (i), the titanium nitride film or the titanium oxynitride film having a film thickness of 3 to 100 nm is formed in the step (ii), the hydrocarbon film having a film thickness of 5 to 100 nm is formed in the step (iii), and the silicon oxide film having a film thickness of 10 to 20 nm is formed in the step (iv).

7. The method for forming a multi-layer film according to claim 3, wherein the under layer film having a film thickness of 30 to 20,000 nm is formed in the step (i), the titanium nitride film or the titanium oxynitride film having a film thickness of 3 to 100 nm is formed in the step (ii), the hydrocarbon film having a film thickness of 5 to 100 nm is formed in the step (iii), and the silicon oxide film having a film thickness of 10 to 20 nm is formed in the step (iv).

8. The method for forming a multi-layer film according to claim 4, wherein the under layer film having a film thickness of 30 to 20,000 nm is formed in the step (i), the titanium nitride film or the titanium oxynitride film having a film thickness of 3 to 100 nm is formed in the step (ii), the hydrocarbon film having a film thickness of 5 to 100 nm is formed in the step (iii), and the silicon oxide film having a film thickness of 10 to 20 nm is formed in the step (iv).

9. A patterning process comprising the steps of:
(A) forming a photoresist film on the multi-layer film which has been formed on the substrate by the method for forming a multi-layer film according to claim 1;
(B) forming a photoresist pattern by subjecting the photoresist film to exposure and development;
(C) transferring the pattern to the silicon oxide film by dry etching using the photoresist pattern as a mask;
(D) transferring the pattern to the hydrocarbon film by dry etching using the silicon oxide film to which the pattern has been transferred as a mask;

(E) transferring the pattern to the titanium nitride film or the titanium oxynitride film by dry etching using the hydrocarbon film to which the pattern has been transferred as a mask;
(F) transferring the pattern to the under layer film by dry etching using the titanium nitride film or the titanium oxynitride film to which the pattern has been transferred as a mask; and
(G) transferring the pattern to the substrate by dry etching using the titanium nitride film or the titanium oxynitride film and the under layer film to which the pattern has been transferred as a mask.

10. A patterning process comprising the steps of:
(A) forming a photoresist film on the multi-layer film which has been formed on the substrate by the method for forming a multi-layer film according to claim 2;
(B) forming a photoresist pattern by subjecting the photoresist film to exposure and development;
(C) transferring the pattern to the silicon oxide film by dry etching using the photoresist pattern as a mask;
(D) transferring the pattern to the hydrocarbon film by dry etching using the silicon oxide film to which the pattern has been transferred as a mask;
(E) transferring the pattern to the titanium nitride film or the titanium oxynitride film by dry etching using the hydrocarbon film to which the pattern has been transferred as a mask;
(F) transferring the pattern to the under layer film by dry etching using the titanium nitride film or the titanium oxynitride film to which the pattern has been transferred as a mask; and
(G) transferring the pattern to the substrate by dry etching using the titanium nitride film or the titanium oxynitride film and the under layer film to which the pattern has been transferred as a mask.

11. A patterning process comprising the steps of:
(A) forming a photoresist film on the multi-layer film which has been formed on the substrate by the method for forming a multi-layer film according to claim 3;
(B) forming a photoresist pattern by subjecting the photoresist film to exposure and development;
(C) transferring the pattern to the silicon oxide film by dry etching using the photoresist pattern as a mask;
(D) transferring the pattern to the hydrocarbon film by dry etching using the silicon oxide film to which the pattern has been transferred as a mask;
(E) transferring the pattern to the titanium nitride film or the titanium oxynitride film by dry etching using the hydrocarbon film to which the pattern has been transferred as a mask;
(F) transferring the pattern to the under layer film by dry etching using the titanium nitride film or the titanium oxynitride film to which the pattern has been transferred as a mask; and
(G) transferring the pattern to the substrate by dry etching using the titanium nitride film or the titanium oxynitride film and the under layer film to which the pattern has been transferred as a mask.

12. A patterning process comprising the steps of:
(A) forming a photoresist film on the multi-layer film which has been formed on the substrate by the method for forming a multi-layer film according to claim 4;
(B) forming a photoresist pattern by subjecting the photoresist film to exposure and development;
(C) transferring the pattern to the silicon oxide film by dry etching using the photoresist pattern as a mask;
(D) transferring the pattern to the hydrocarbon film by dry etching using the silicon oxide film to which the pattern has been transferred as a mask;
(E) transferring the pattern to the titanium nitride film or the titanium oxynitride film by dry etching using the hydrocarbon film to which the pattern has been transferred as a mask;
(F) transferring the pattern to the under layer film by dry etching using the titanium nitride film or the titanium oxynitride film to which the pattern has been transferred as a mask; and
(G) transferring the pattern to the substrate by dry etching using the titanium nitride film or the titanium oxynitride film and the under layer film to which the pattern has been transferred as a mask.

13. A patterning process comprising the steps of:
(A) forming a photoresist film on the multi-layer film which has been formed on the substrate by the method for forming a multi-layer film according to claim 5;
(B) forming a photoresist pattern by subjecting the photoresist film to exposure and development;
(C) transferring the pattern to the silicon oxide film by dry etching using the photoresist pattern as a mask;
(D) transferring the pattern to the hydrocarbon film by dry etching using the silicon oxide film to which the pattern has been transferred as a mask;
(E) transferring the pattern to the titanium nitride film or the titanium oxynitride film by dry etching using the hydrocarbon film to which the pattern has been transferred as a mask;
(F) transferring the pattern to the under layer film by dry etching using the titanium nitride film or the titanium oxynitride film to which the pattern has been transferred as a mask; and
(G) transferring the pattern to the substrate by dry etching using the titanium nitride film or the titanium oxynitride film and the under layer film to which the pattern has been transferred as a mask.

14. A patterning process comprising the steps of:
(A) forming a photoresist film on the multi-layer film which has been formed on the substrate by the method for forming a multi-layer film according to claim 6;
(B) forming a photoresist pattern by subjecting the photoresist film to exposure and development;
(C) transferring the pattern to the silicon oxide film by dry etching using the photoresist pattern as a mask;
(D) transferring the pattern to the hydrocarbon film by dry etching using the silicon oxide film to which the pattern has been transferred as a mask;
(E) transferring the pattern to the titanium nitride film or the titanium oxynitride film by dry etching using the hydrocarbon film to which the pattern has been transferred as a mask;
(F) transferring the pattern to the under layer film by dry etching using the titanium nitride film or the titanium oxynitride film to which the pattern has been transferred as a mask; and
(G) transferring the pattern to the substrate by dry etching using the titanium nitride film or the titanium oxynitride film and the under layer film to which the pattern has been transferred as a mask.

15. A patterning process comprising the steps of:
(A) forming a photoresist film on the multi-layer film which has been formed on the substrate by the method for forming a multi-layer film according to claim 7;
(B) forming a photoresist pattern by subjecting the photoresist film to exposure and development;

(C) transferring the pattern to the silicon oxide film by dry etching using the photoresist pattern as a mask;
(D) transferring the pattern to the hydrocarbon film by dry etching using the silicon oxide film to which the pattern has been transferred as a mask;
(E) transferring the pattern to the titanium nitride film or the titanium oxynitride film by dry etching using the hydrocarbon film to which the pattern has been transferred as a mask;
(F) transferring the pattern to the under layer film by dry etching using the titanium nitride film or the titanium oxynitride film to which the pattern has been transferred as a mask; and
(G) transferring the pattern to the substrate by dry etching using the titanium nitride film or the titanium oxynitride film and the under layer film to which the pattern has been transferred as a mask.

16. A patterning process comprising the steps of:
(A) forming a photoresist film on the multi-layer film which has been formed on the substrate by the method for forming a multi-layer film according to claim 8;
(B) forming a photoresist pattern by subjecting the photoresist film to exposure and development;
(C) transferring the pattern to the silicon oxide film by dry etching using the photoresist pattern as a mask;
(D) transferring the pattern to the hydrocarbon film by dry etching using the silicon oxide film to which the pattern has been transferred as a mask;
(E) transferring the pattern to the titanium nitride film or the titanium oxynitride film by dry etching using the hydrocarbon film to which the pattern has been transferred as a mask;
(F) transferring the pattern to the under layer film by dry etching using the titanium nitride film or the titanium oxynitride film to which the pattern has been transferred as a mask; and
(G) transferring the pattern to the substrate by dry etching using the titanium nitride film or the titanium oxynitride film and the under layer film to which the pattern has been transferred as a mask.

17. The patterning process according to claim 9, wherein the dry etching in the step (F) is carried out by using one or more etching gases selected from an oxygen gas, a hydrogen gas, an ammonia gas, a carbon dioxide gas, a carbon monoxide gas, and a sulfur dioxide gas.

18. The patterning process according to claim 10, wherein the dry etching in the step (F) is carried out by using one or more etching gases selected from an oxygen gas, a hydrogen gas, an ammonia gas, a carbon dioxide gas, a carbon monoxide gas, and a sulfur dioxide gas.

19. The patterning process according to claim 11, wherein the dry etching in the step (F) is carried out by using one or more etching gases selected from an oxygen gas, a hydrogen gas, an ammonia gas, a carbon dioxide gas, a carbon monoxide gas, and a sulfur dioxide gas.

20. The patterning process according to claim 13, wherein the dry etching in the step (F) is carried out by using one or more etching gases selected from an oxygen gas, a hydrogen gas, an ammonia gas, a carbon dioxide gas, a carbon monoxide gas, and a sulfur dioxide gas.

* * * * *